US006745365B2

(12) United States Patent
Kokuryo et al.

(10) Patent No.: US 6,745,365 B2
(45) Date of Patent: Jun. 1, 2004

(54) CODER WITH ERROR CORRECTION, DECODER WITH ERROR CORRECTION AND DATA TRANSMISSION APPARATUS USING THE CODER AND DECODER

(75) Inventors: Yoshiro Kokuryo, Tachikawa (JP); Atsushi Mizuno, Iruma (JP); Kunihiko Kondo, Kodaira (JP); Nobuo Tsukamoto, Akishima (JP); Kenji Terada, Komae (JP); Tetsuomi Ikeda, Machida (JP)

(73) Assignees: Hitachi Kokusai Electric Inc., Tokyo (JP); Nippon Hoso Kyokai, Tokyo (JP)

( * ) Notice: Subject to any disclaimer, the term of this patent is extended or adjusted under 35 U.S.C. 154(b) by 298 days.

(21) Appl. No.: 09/749,415

(22) Filed: Dec. 28, 2000

(65) Prior Publication Data

US 2001/0008022 A1 Jul. 12, 2001

(30) Foreign Application Priority Data

Dec. 28, 1999 (JP) .............................. 11-373754
Mar. 31, 2000 (JP) ........................ 2000-099194

(51) Int. Cl.[7] .......................................... H03M 13/03
(52) U.S. Cl. .................... 714/786; 375/261; 375/262; 375/265; 714/794
(58) Field of Search ................................ 714/786, 794; 375/262, 17, 261, 39, 43, 265, 264, 286; 371/43

(56) References Cited

U.S. PATENT DOCUMENTS

| 4,622,670 A | | 11/1986 | Martin | |
| 4,713,817 A | * | 12/1987 | Wei | 371/43 |
| 4,939,555 A | * | 7/1990 | Calderbank et al. | 375/17 |
| 5,095,392 A | | 3/1992 | Shimazaki et al. | |
| 5,115,438 A | | 5/1992 | Friederichs et al. | |
| 5,115,453 A | * | 5/1992 | Calderbank et al. | 375/39 |
| 5,263,051 A | | 11/1993 | Eyuboglu | |
| 5,457,705 A | | 10/1995 | Todoroki | |
| 5,812,601 A | * | 9/1998 | Schramm | 375/262 |
| 5,848,102 A | * | 12/1998 | Zehavi et al. | 375/261 |
| 5,970,098 A | * | 10/1999 | Herzberg | 375/264 |
| 6,034,996 A | * | 3/2000 | Herzberg | 375/265 |
| 6,536,010 B1 | * | 3/2003 | Brink | 714/794 |

FOREIGN PATENT DOCUMENTS

| EP | 610648 | 8/1994 |
| JP | 832633 | 2/1996 |

* cited by examiner

Primary Examiner—Albert Decady
Assistant Examiner—Dipakkumar Gandhi
(74) Attorney, Agent, or Firm—Antonelli, Terry, Stout & Kraus, LLP

(57) ABSTRACT

An encoder and a decoder each having an error correcting operation, and a data transmission apparatus using them for data transmission in a multilevel modulation system. In transmission data is converted into parallel data. One bit thereof is inputted to a convolutional encoder to output two bits. Two bit data and another signal of the parallel data not inputted to the convolutional encoder are respectively separated into real part and imaginary part to independently decide signal points for the parallel data. In reception an area is similarly decided independently for real and imaginary parts and metric is assigned for the data. Real and imaginary parts are combined with each other for Viterbi decoding. Result thereof is fed to a convolutional encoder similar in constitution to that on transmission side. Using convolutional encoding output and decided area, transmission data is decoded.

19 Claims, 20 Drawing Sheets

| VALUES OF E' OR F' | $G_1, G_2$ |
|---|---|
| 1 OR MORE | 1 1 1 |
| 1 ~0.875 | 1 1 1 |
| 0.875~0.75 | 1 1 0 |
| 0.75~0.625 | 1 0 1 |
| 0.625~0.5 | 1 0 0 |
| 0.5 ~0.375 | 0 1 1 |
| 0.375~0.25 | 0 1 0 |
| 0.25 ~0.125 | 0 0 1 |
| 0.125~0 | 0 0 0 |
| 0 OR LESS | 0 0 0 |

FIG. 4A
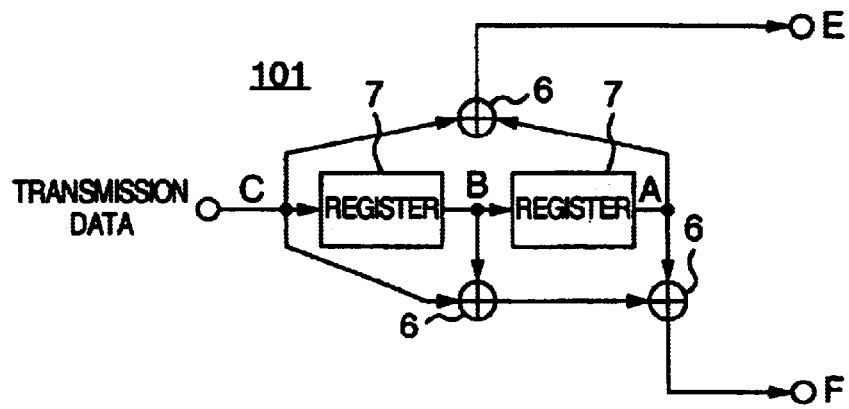
FIG. 4B
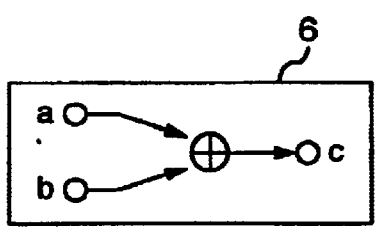
FIG. 4C
| ⊕ TRUTH TABLE | | |
|---|---|---|
| INPUT | | OUTPUT |
| a | b | c |
| 0 | 0 | 0 |
| 0 | 1 | 1 |
| 1 | 0 | 1 |
| 1 | 1 | 0 |
FIG. 4D
| TIME | TRANSMISSION DATA | INTERNAL DATA | | OUTPUT DATA | |
|---|---|---|---|---|---|
| | C | B | A | E | F |
| 1 | 1 | 1 | 1 | 0 | 1 |
| 2 | 0 | 1 | 1 | 1 | 0 |
| 3 | 0 | 0 | 1 | 1 | 1 |
| 4 | 1 | 0 | 0 | 1 | 1 |
| 5 | 0 | 1 | 0 | 0 | 1 |
| 6 | 0 | 0 | 1 | 1 | 1 |
| 7 | 0 | 0 | 0 | 0 | 0 |
| 8 | 1 | 0 | 0 | 1 | 1 |
| 9 | 1 | 1 | 0 | 1 | 0 |
| 10 | 0 | 1 | 1 | 1 | 0 |
| 11 ⋮ | ⋮ | ⋮ | ⋮ | ⋮ | ⋮ |

FIG. 25

DATA BIT LAYOUT | I1 | I2 | I3 | I4 | Q1 | Q2 | Q3 |

FIG. 26

CODER WITH ERROR CORRECTION, DECODER WITH ERROR CORRECTION AND DATA TRANSMISSION APPARATUS USING THE CODER AND DECODER

BACKGROUND OF THE INVENTION

The present invention relates to an error correction technique in a digital data transmission system, and in particular, to an encoder having an error correcting operation, a decoder having error correcting operation, and a data transmission apparatus using the encoder and decoder operating in a digital multilevel modulation system.

For mobile and terrestrial digital radio communication, there have been heretofore put in use data transmission systems using digital multilevel modulation systems such as a 16 or 64 quadrature amplitude modulation (QAM).

In a prior art digital multilevel amplitude modulation system, transmission data to be transmitted is converted into multilevel data using, for example, an encoder as shown in FIG. 1.

In the example of conversion to multilevel data by the encoder as shown in FIG. 1, to decide coordinates of signal points multilevel-converted in accordance with transmission data on a two-dimensional plane of signal points including an I-axis for real numbers and a Q-axis for imaginary numbers, transmission data in a serial form is inputted to a seal/parallel converter 1A and is converted into data in a parallel form.

For example, in the 16 QAM system, the signal point plane is represented on a constellation plane as shown in FIG. 2. The plane includes 16 signal points each of which is defined by values of a 4-bit transmission data signal. In this case, therefore, the serial/parallel converter 1A produces the signals having 4 bits.

Consequently, the serial/parallel converter 1A includes four registers 7 as shown in FIG. 1. Output signals of respective registers 7 are sequentially transferred through the registers every predetermined clock signal period and are fed to respective latches 51 every clock signal period for 4-bits. 4-bit parallel data is resultantly inputted to a signal point generator 3A. The generator 3A accordingly decides signal points on the plane shown in FIG. 2 and outputs amplitude values respectively on the I-axis component, namely, in-phase amplitude component, and the Q-axis component, namely, quadrature amplitude component, to roll-off filters 4 and 5 (ROF: hereinafter referred to as filter), respectively. Signals outputted from the filters 4 and 5 are fed to transmission process circuit of a succeeding stage.

In the signal point generator 3A, of the inputted 4-bit data signal, respective bits of 2 bits thereof are made in-phase component I1 and I2, and respective bits of the remaining 2 bits are made quadrature components Q1 and Q2, and signal points on the constellation plane are decided in accordance with combination of the values of the respective components I1, I2, Q1 and Q2 as shown in FIG. 2.

Assuming, for example, that the values of the components I1, I2, Q1 and Q2 are 0, 0, 1, and 0. Then, the point of the coordinate (+1, +3) on the constellation plane is the signal point corresponding to the combination of the component values 0, 0, 1, and 0.

In this way, a signal indicating I-axis coordinate +1, which indicates that the in-phase amplitude component level is +1, is fed to the roll-off filter 4 and a signal indicating Q-axis coordinate +3, which indicates that the quadrature amplitude component level is +3, is fed to the roll-off filter 5.

The technique of the quadrature amplitude modulation of the roll-off filters 4 and 5 are not directly related to the present invention and hence description thereof will be omitted.

A 16 QAM system has been employed as an example of the multilevel modulation system. However, in other multilevel modulation systems, the configuration above is basically applicable. Only the number of signal points and the number of bits to define the signal point differ between the systems.

The multilevel transmission data will be thereafter transmitted from the transmitting apparatus to a receiving apparatus. A general technique regarding the multilevel signal generation and a general technique for subsequent modulation and transmission have been described in detail in pages 82 to 89 of "THE THEORY AND PRACTICE OF MODEM DESIGN" written by John A. C. Bingham and published from A WILEY-INTERSCIENCE PUBLICATION in 1988. Therefore, the techniques will not be described in detail. The disclosure of the document is hereby incorporated by reference herein.

SUMMARY OF THE INVENTION

In the data transmission system as mentioned above, in a case in which factors to deteriorate transmission data to be transmitted in the transmission path are increased, when the transmission data is received by the receiving apparatus, the received data is erroneous data which is considerably different in the data value of the original transmission data generated at the transmitting apparatus. The data receiving apparatus cannot easily reproduce the original transmission data and a problem of the reproduced data being erroneous occurs.

In a known method, in reproducing transmission data received, it is reproduced by convolutional encoders and Viterbi decoders by minimizing occurrence of data errors to a possible extent. However, in a transmitting unit corresponding to the data reproduction method, it is necessary that serial transmission data is converted into parallel data n bits by n bits and thereafter one convolutional encoder is used for each bit of the parallel data to generate an error correction code. For example, in a 16 QAM system (n=4), one convolution coder is employed for each bit of parallel data of 2-bit length. The encoder encodes data of one bit of the 2 bits to generate an in-phase two-bit component (I) signal and encodes data of the other bit of the 2 bits to generate a quadrature two-bit component (Q) signal. A rate between the number of bits of data before convolution and that of data after convolution is called "coding rate". In the example, since two convolutional encoders are used to encode a 2-bit input signal to generate a 4-bit signal in the overall system, the coding rate is 2 bits/4 bits, that is, ½. The coding rate is associated with a data transmission rate. In the case where the coding rate is as small as 50% as in the example, the data transmission rate is correspondingly lowered, thereby reducing the transmission efficiency.

Since the configuration of FIG. 1 does not include an error correcting function, the transmission rate of the transmission path is equal to the data rate of the transmission data, namely, the coding rate is 1, transmission efficiency is not lowered. In the case where however an error correcting function is provided, transmission efficiency is reduced because of the coding rate.

In the case where the error correcting function is not disposed making the coding rate 1, the possibility that the data transmission efficiency falls is few. However, data is likely to be influenced by, for example, noise on the transmission path. This leads to an undesirable result that bit errors occur in reception data received.

On the other hand, in the case where the error correcting function is added, possibility of being influenced by noise on the transmission path can be minimized and occurrence of bit errors in reception data can be lowered. However, the data transmission rate is reduced because of the coding rate.

Assuming, for example, that the transmission system has a data transmission rate of 54 megabits per second (Mbit/s) on transmission path, the data transmission rate is lowered to 27 Mbit/s when the coding rate is ½, when considered in terms of data amount before convolutional encoding.

For error correction, since the transmission side requires convolutional encoders and the reception side requires Viterbi decoders, the encoder and the decoder must be more efficiently operated to improve the coding rate.

It is therefore an object of the present invention to provide an encoder having an error correcting function, a decoder having an error correcting function, and a transmission apparatus using the encoder and decoder in which the coding rate is increased by an error correcting function and hence data transmission efficiency is improved.

To achieve the object, there is provided in accordance with one aspect of the present invention an encoder having an error correcting operation for use in a transmitting unit which sends transmission data in a $2^n$ QAM system (n is an integer equal to or more than four). The encoder includes a converter section to convert the transmission data into an (n−1)-bit parallel data and a convolutional encoder to receive one bit of the (n−1)-bit data. The encoder produces 2-bit data. The 2-bit data from the convolutional encoder is separated into a 1-bit in-phase component and a 1-bit quadrature component. Using the remaining bits of the (n−1)-bit data and the 2-bit data from the convolutional encoder, multilevel signals are generated according to the $2^n$ QAM system.

In the case where n is an even number equal to or more than four, the multilevel signals of the $2^n$ QAM system may be configured as below.

In a signal point plane of in-phase amplitude components (I) and quadrature amplitude components (Q), an identical bit layout is assigned to in-phase components at signal points having an identical in-phase amplitude component and an identical bit layout is assigned to quadrature components at signal points having an identical quadrature amplitude component.

Mutually different bit values, i.e., 0 and 1, are alternately assigned to in-phase component bits corresponding to an in-phase component output from the convolutional encoder for signal points adjacent in the I-axis direction to each other.

Mutually different bit values, i.e., 0 and 1, are alternately assigned to quadrature component bits corresponding to a quadrature component output from the convolutional encoder for signal points adjacent in the Q-axis direction to each other.

In the case where n is an odd number equal to or more than five, the multilevel signals of the $2^n$ QAM system may be configured as below.

The signal point plane of in-phase amplitude components (I) and quadrature amplitude components (Q) is subdivided into a first area and a plurality of second areas.

In the first area, an identical bit layout of in-phase component is assigned to in-phase components at signal points having an identical in-phase amplitude component and an identical bit layout of quadrature component is assigned to quadrature components at signal points having an identical quadrature amplitude component.

Bit layouts other than those assigned to the first area are assigned to signal points in the second areas.

Throughout the first and second areas, mutually different bit values, i.e., 0 and 1, are alternately assigned to in-phase component bits corresponding to the in-phase component output from the convolutional encoder for signal points adjacent in the I-axis direction to each other. Mutually different bit values, i.e., 0 and 1, are alternately assigned to quadrature component bits corresponding to the quadrature component output from the convolutional encoders for signal points adjacent in the Q-axis direction to each other. In the case where the direction in which the adjacent signal points crosses a boundary between the first and second areas, the order of "0" and "1" is kept unchanged. In the case where the direction in which the adjuacent signal points extend is parallel with the direction of a boundry between the first area and the second area, the order of "0" and "1" is adjusted to be equal to that in the adjoining first area. The bit layout must be unique to each signal point.

Favorably, in the case where bit layouts not assigned to the first area are assigned in the second area, an identical bit layout of in-phase component is assigned to in-phase components at signal points having an identical in-phase amplitude component as available as possible from the unassigned bit layouts and/or an identical bit layout of quadrature component is assigned to quadrature components at signal points having an identical quadrature amplitude component as available as possible from the unassigned bit layouts.

In accordance with another aspect of the present invention, there is provided a decoder having an error correcting operation for use with $2^n$ QAM signals (n is an integer equal to or more than four). In the decoder, a signal point plane of an in-phase amplitude component (I)—quadrature amplitude component (Q) coordinate system is divided in directions respectively of in-phase and/or quadrature amplitude components into a plurality of areas. The decoder includes an area deciding section for receiving an in-phase amplitude component (I) signal and a quadrature amplitude component (Q) signal of the QAM signals, the section deciding to which ones of the plurality of the divided areas each of the in-phase amplitude component (I) and quadrature amplitude component (Q) signals belongs, respectively; a metric assigning section for producing, according to a result of decision by said area deciding section, metric for each of the in-phase amplitude component (I) and quadrature amplitude component (Q) signals, a Viterbi decoder for receiving the metric for the in-phase amplitude component (I) and quadrature amplitude component (Q) signals, a convolutional encoder for receiving a data signal outputted from said Viterbi decoder, and a parallel/serial converter for receiving an output from said Viterbi decoder and outputs from the convolutional encoder.

In accordance with another aspect of the present invention, there is provided a data transmitting apparatus having the error correcting function. The apparatus includes a transmitter section including the encoder with error correction and a receiver section including the decoder with error correction.

BRIEF DESCRIPTION OF THE DRAWINGS

The foregoing and other objects, features, and advantages of the present invention will be apparent from the following more particular description of the presently preferred embodiments of the invention as illustrated in the accompanying wherein:

FIGS. 4A and 4B are diagrams showing an example of constitution of a convolutional encoder;

FIGS. 4C and 4D are tables for explaining the operation of convolutional encoders respectively of FIGS. 4A and 4B;

FIG. 25 is a graph showing an example of bit layouts of signal points on a constellation of the 128 QAM system; and FIG. 26 is a graph to explain rules of bit layouts of signal points on a constellation of the embodiment associated with the 128 QAM system.

DESCRIPTION OF THE EMBODIMENTS

Prior to explanation of an embodiment, description will be given of a principle of the present invention.

Referring to FIGS. 3A, 3B, 4A to 4D, and 5 to 7, description will be given of a data transmission method to transmit data by minimizing data errors to a maximum possible extent using a convolutional encoder and a Viterbi decoder.

Figures 3A, 3B:
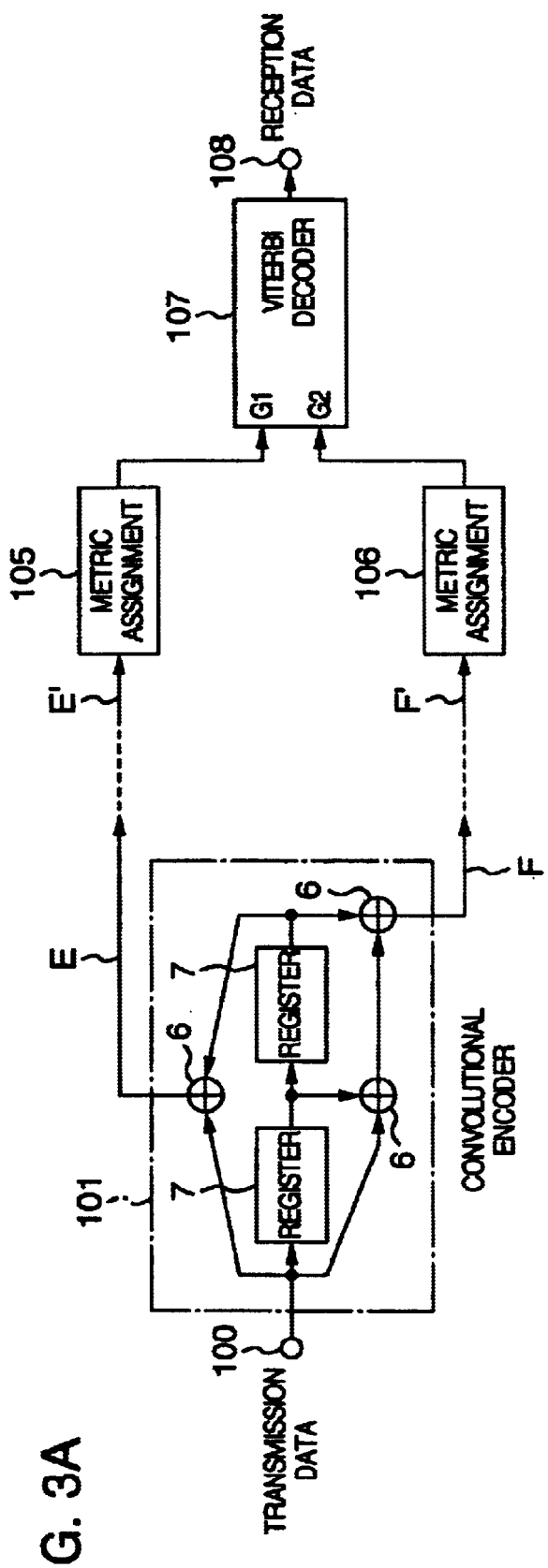
FIGS. 3A and 3B are diagrams for explaining an example of an error correction method using a convolutional encoder and a Viterbi decoder.

FIG. 3A shows an example of a data reproducing unit including a convolutional encoder and a Viterbi decoder in a block diagram. FIG. 3B is a table to explain metric used by the Viterbi decoder.

In FIG. 3A, serial transmission data is fed via an input terminal 100 to a convolutional encoder 101.

The encoder 101 of FIG. 3A has a quite simple configuration as shown in FIG. 4A, namely, being made up of exclusive OR (EXOR) circuits 6 and registers 7. In this example, the transmission data C is assumed as shown in FIG. 4D.

1, 0, 0, 1, 0, 0, 0, 1, 1, 0,

In the initial state, it is assumed that the outputs A and B of respective registers 7 are set to data at level 1.

The EXOR circuit 6 has an input and output logic as shown in FIG. 4B. For a combination of inputs a and b, a logical value of an output c is assumed to be decided by a truth table shown in FIG. 4C.

Operation of the convolutional encoder 101 will be described by referring to FIG. 4D which shows transitions of input and output data values.

At time 1, transmission data C is at level 1 as above. However, register outputs B and A keep the initial state and hence each output is at level 1.

Resultantly, output E at level 0 is obtained as a result of the EXOR operation between data A and data C. For output F, the EXOR operation between data B and data C results in level 0, and level 0 is EXORed with data A to obtain level 1.

At time 2, transmission data C is at level 0. At this point of time, data C at time 1 is shifted to data B and data B at time 1 is shifted to data A. At time 2, data C is therefore at level 0 and data B and data A are at level 1. Therefore, output data E is at level 1 and output data F is at level 0.

At time 3, transmission data C is at level 0. At this point of time, data C at time 2 is shifted to data B and data B at time 1 is shifted to data A. At time 3, data C, B, and A are therefore at levels 0, 0, and 1, respectively. Output data E and F are at level 1.

The levels of output data E and F are determined according to the level of transmission data C as above.

In this connection, the levels of output data E and F are not uniquely decided according to the level of the transmission data C at a predetermined point of time, but are also decided by a relationship between the levels of an register output data B and A.

In short, the obtained data E and F include information of transmission data sequence in the past at points of time earlier than the points of time at which data E and F are output. Therefore, according to a rule decided by the configuration of the registers and the EXOR circuits 6, levels of the output data E and F are decided by data at the current time using the transmission data sequence in the past. As the stages of registers increases, the output data contains more information of the data sequence in the past.

The number of stages of registers is generally called "constraint length". In the example of FIGS. 4A to 4D, the convolutional encoder has a constraint length of three. In general, a convolutional encoder has appropriately a constraint length of seven.

Returning to FIGS. 3A and 3B, the output data E and F from the convolutional encoder 101 (output data E and F shown in FIG. 4) are sent to a receiving apparatus via a transmission path.

On the receiving apparatus, output data E' and F' are received.

In the case where the transmission path is free of deterioration factors such as noise and multi-path echo, the data E and F on the transmission apparatus side are intactly received as data E' and F' on the reception apparatus side. In the case where deterioration factors appear on the transmission path, the data E' and F' are different respectively from the data E and F according to the quantity of deterioration factors.

Assuming, for example, each of the data E and F is at level 1 or 0. In the case where deterioration factors take place, the data E' and F' may be at an intermediate level and take, for example, a value of 0.7 or 0.1. The data may be at a level more than level 1 and take, for example, a value of 1.3 or, the data may take a value equal to or less than 0.

To overcome the difficulty, a Viterbi decoder 107 reproduces the transmission data by removing the influence of the deterioration factors. In this explanation, the system includes a Viterbi decoder put to the market with a type of STEL-2060/CR from STANFORD TELECOM.

The data E' and F' are fed to the metric assignment sections 105 and 106, respectively. In response to the data E' and F', the sections 105 and 106 respectively determine values of digital data G1 and G2 of 3 bit length and feed the data to input ports of the Viterbi decoder 107 using the table of FIG. 3.

As can be seen from FIG. 3, the digital data G1 take a larger value and smaller value as the level of E' approaches level 1 and level 0, respectively. The data G2 take a larger value and smaller value as the level of F' approaches level 1 and level 0, respectively.

The data G1 is information called "metric" to represent distance between the level of the data E' and level 1 or between the data E' and level 0. The data G2 is also "metric" to represent distance between the level of the data F' and level 1 or between the level of the data F' and level 0.

For each signal point, the Viterbi decoder 107 inputs information indicating distance between level 1 or 0 and a received signal of a data sequence constrained by the past data in the convolutional encoder 101 of the transmitting apparatus side. The Viterbi decoder 107 checks the information in time series to reproduce data without errors by removing influences of deterioration factors on the transmission path. The decoder 107 delivers resultant data from an output terminal 108. The data thus reproduced is substantially equal to the transmission data received via the input port 100.

The principle of the Viterbi decoding to reproduce data according to the data sequence generated by the convolutional encoder 101 and the metric of received data has been written in various articles, for example, in pages 353 to 355 of "THE THEORY AND PRACTICE OF MODEM DESIGN" written by John A. C. Bingham and published in 1988 and in pages 11 to 19 of "A Programmatic Approach to Trellis-Coded Modulation" written by Andrew J. Viterbi et al in "IEEE Communication Magazine" published in July 1989. The disclosures of the articles are hereby incorporated by reference herein. Details thereof will be therefore not described.

Figure 6:
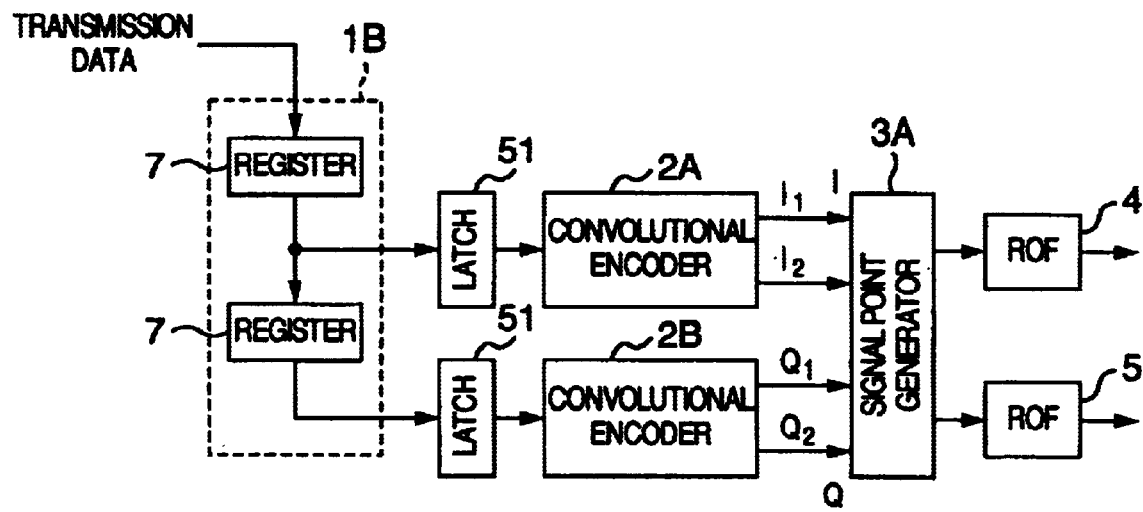
FIG. 6 is a block diagram showing an example of a configuration of an encoder of a digital multilevel modulation system including an error correcting function.

FIG. 6 shows an example of an encoder of a multilevel modulation system including such an error correcting function.

In the case where the encoder uses, for example, a 64 QAM system, 2-bit parallel signals outputted from a serial/parallel converter 1B and latches 51 are separated into one bit for an in-phase component side and into one bit for a quadrature component side. These one bits are respectively fed to convolutional encoders 2A and 2B. The encoders 2A and 2B respectively generate 2-bit data I1 and I2 and 2-bit data Q1 and Q2 to be fed to a signal point generator 3A.

The convolutional encoders 2A and 2B may be implemented in various configurations. In practices, a convolutional encoder with a constraint length of 7 shown in FIG. 5 can be used. However, for a convolution encoder of any configuration, the system shown in FIG. 6 can be constructed as long as the encoder has a 1-bit input and a 2-bit output. Therefore, the system can be operated in a multilevel modulation system.

Figure 5:
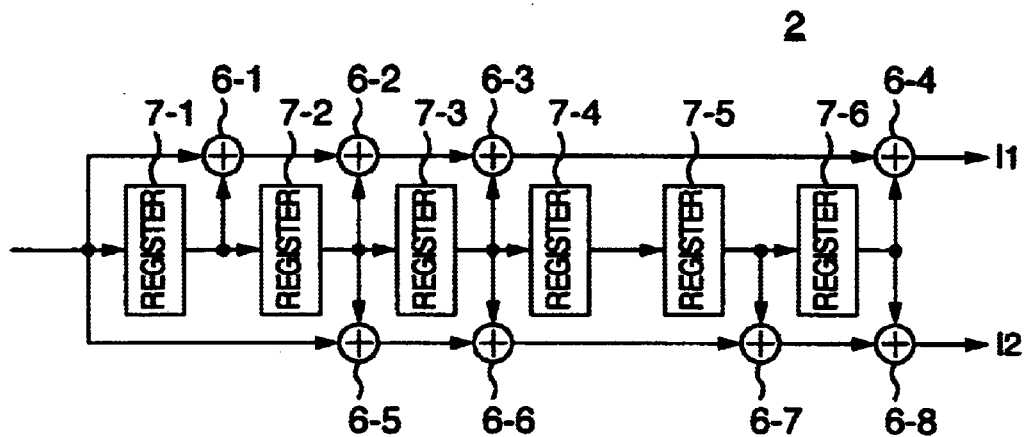
FIG. 5 is a block diagram showing an example of structure of a convolutional encoder with a constraint length of seven.

The convolutional encoder 2 shown in FIG. 5 will be next described.

The encoder 2 and the encoder 101 described with reference to and shown in FIGS. 4A to 4D are the same in basic operation with each other. Transmission data is received by an input port on the left side on FIG. 5 drawing.

At time 1, the input data and an output from a first-stage register 7-1 are EXORed by an EXOR circuit 6-1. The output from the EXOR circuit 6-1 and an output from a second register 7-2 are EXORed by an EXOR circuit 6-2. The output from the EXOR circuit 6-2 and an output from a third register 7-3 are EXORed by an EXOR circuit 6-3. The output from the EXOR circuit 6-3 and an output from a sixth register 7-6 are EXORed by an EXOR circuit 6-4. Resultantly, an output data I1 is produced as indicated on the upper-right corner of FIG. 5.

Similarly, an output data I2 on the lower-right corner of FIG. 5 is obtained by EXORing the input data with outputs respectively from the second to sixth registers 7-2 to 7-6 by respective EXOR circuits 6 in this order.

At time 2, an output value from the fifth register 7-5 is shifted to the output of the sixth register 7-6, the output value from the fourth register 7-4 is shifted to the output of the fifth register 7-5, the output value from the third register 7-3 is shifted to the output of the fourth register 7-4, the output value from the second register 7-2 is shifted to the output of the third register 7-3, the output value of the first register 7-1 is shifted to the output of the second register 7-2 and the input data value is shifted to the output of the first register 7-1. Like the operation at time 1, the EXORing operation is conducted between the input data and output data from the predetermined registers 7 to resultantly produce output I1 and I2.

At time 3, as at time 2, the data are shifted as above. The EXORing operation is conducted between the input data and output data from the predetermined registers 7 to resultantly produce output I1 and I2.

By repetitiously executing the operation to produce the output data I1 and I2, the data inputted to the input port is fed from the left side to the right side in FIG. 5. In the resultant data, quantity of information of the past data is increased as the data proceeds to the right side.

Output data Q1 and Q2 also may be output by using a similar circuitry and in a similar manner.

Figure 1:
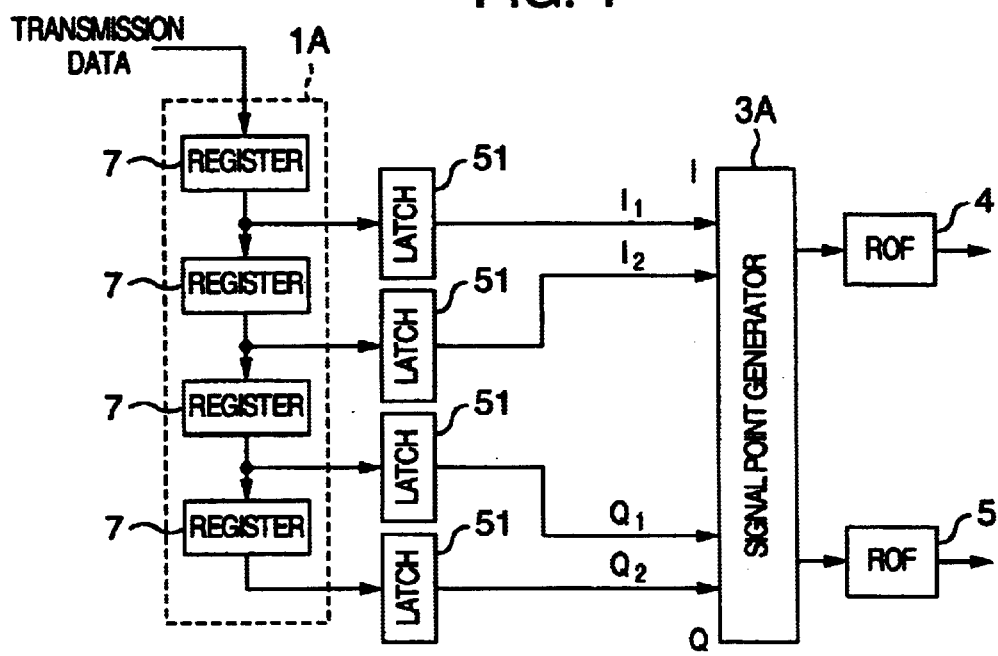
FIG. 1 is a block diagram showing a prior-art encoder in a digital multilevel modulation system not including an error correcting function.

Returning to FIG. 6, the signal point generator decides, as in the coder of the digital multilevel modulation system of FIG. 1 not including the error correcting function, signal points defined by the data I1, I2, Q1, and Q2 on the constellation plane and outputs signals representing in-phase and quadrature amplitude components corresponding to the decided signal points to the roll-off filters 4 and 5, respectively.

Since reception data is produced by the Viterbi decoder on the reception apparatus side, description will be given of operation of the decoder. The operation for the in-phase amplitude component is quite similar to that for the quadrature amplitude component, and hence description will be given only of operation for the in-phase amplitude component.

Figure 7:
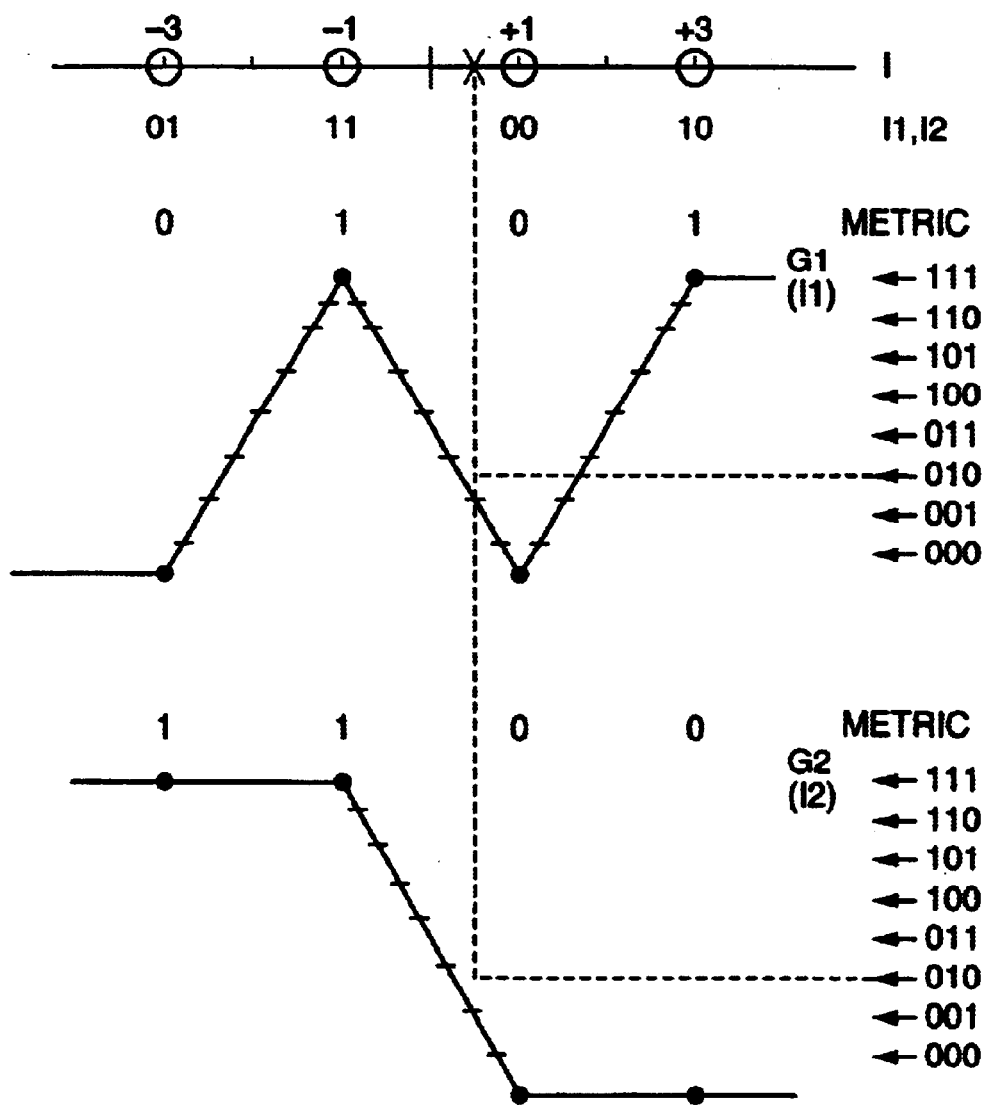
FIG. 7 is a graph for explaining metric assignment necessary to conduct Viterbi encoding on a reception apparatus side.

FIG. 7 shows a graph in which abscissa represents only the in-phase amplitude component I-axis of the two axes of the constellation plane independently and ordinate represents the metric value. In the definitions of FIG. 7, as already shown in FIG. 2, in the case of 16 QAM the components I1 and I2 are respectively values 1 and 0 when amplitude component level is +3, values 0 and 0 when amplitude component level is +1, values 1 and 1 when amplitude component level is −1, and values 0 and 1 when amplitude component level is −3.

As described in conjunction with FIGS. 3A, 3B, and 4A to 4D, the data G1 and G2 inputted to the Viterbi decoder 107 from the outputs of the metric assignment sections 105 and 106 are metric items. To obtain the metric items, distance between level 1 and level 0 of each of the components I1 and I2 is equidistantly divided by eight. The distances used as metric items.

Figure 2:
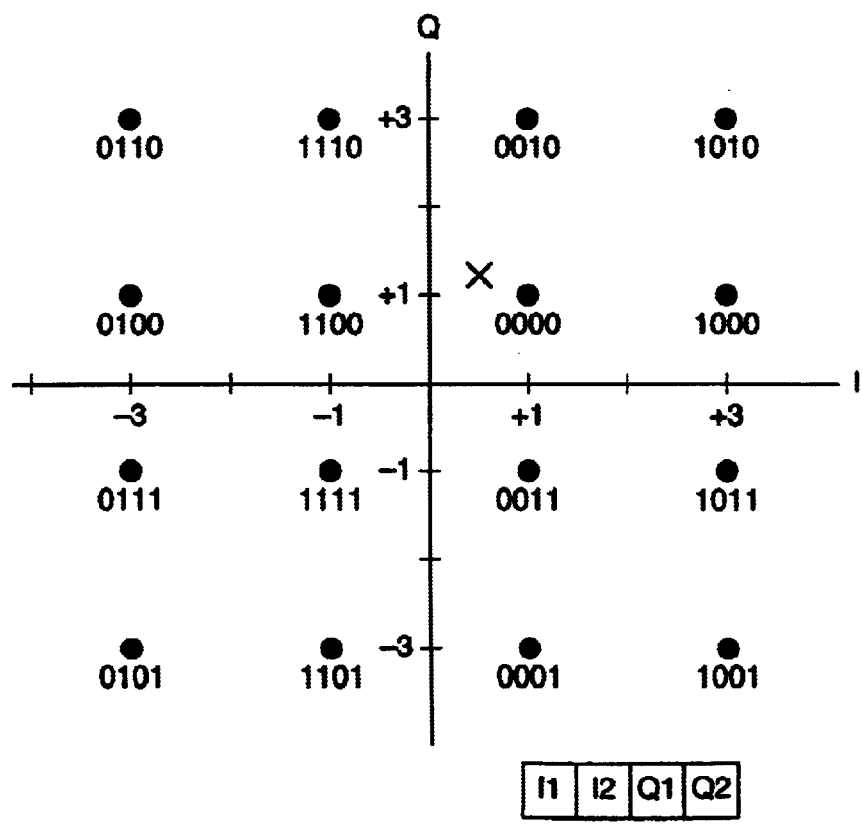
FIG. 2 is a graph showing bit layouts of signal points on a constellation of a 16 QAM system in the encoder shown in FIG. 1.

Reception of a signal point indicated by "X" in FIG. 2 corresponds to a point marked by "X" in FIG. 7. At this point, metric values at the vicinity of intersections at which the broken line crosses the zigzag line shown in FIG. 7 are selected. Thus, data G1 has a metric value of 010 and data G2 has a metric value of 010.

This also applies to reception of a subsequent point. That is, metric values are set to the Viterbi decoder 107. By repeating the operation for each signal point, correct reception data is reproduced and outputted.

The coder having an error correcting operation shown in FIG. 6 encodes a 2-bit input signal into a 4-bit signal, and hence the coding rate is ½.

As already described, the coding rate relates to the data transmission rate. In the case where the coding rate is small, the data transmission rate is reduced and transmission efficiency is deteriorated.

In the encoder of digital multilevel modulation system shown in FIG. 1 not including an error correcting function, the data transmission rate on the transmission path is equal to the data transmission rate of the transmission data. Transmission efficiency is not deteriorated.

However, in the case where an error correcting function is added to the configuration, transmission efficiency is deteriorated because of the error correcting function.

Although the data transmission efficiency is not deteriorated in the case where the error correcting function is not included, the data is likely to be influenced by noise and the like on the transmission path. This is undesirable because of occurrence of bit errors.

In the case where the error correcting function is present, the data is reduced the influence by the noise on the transmission path and the chance of occurrence of bit errors can be decreased. However, the data transmission rate is lowered because of the coding rate.

To correct errors, a convolutional encoder function is required on the transmission apparatus side and a Viterbi decoder function is necessary on the reception apparatus side. To increase the coding rate, the functions must be efficiently operated.

Description will now be given in detail of a coding technique of a QAM system in which the error correcting function is used and the coding rate is increased in accordance with the present invention.

As described above, the convolutional encoder in a transmitting apparatus inherently converts 1-bit data into 2-bit data in which data includes constraint data of the past data earlier than the data to be convolution-coded now, i.e., information of data in the past. Therefore, the data can be Viterbi decoded at the receiving apparatus to reproduce reception data with less error. Consequently, the coding rate can be improved by the efficient operating of the convolutional encoder.

In the example of an encoder of a multilevel modulation system shown in FIG. 6, 2-bit data from each of the convolutional encoders is used for each of the in-phase component (I) and the quadrature component (Q). However, in accordance with the present invention, one bit of the 2-bit data from an encoder is assigned to the in-phase component (I) and the remaining one bit is assigned to the quadrature component (Q). On the receiving apparatus, the Viterbi decoding is conducted using the 2-bit data to reproduce and output correct reception data without any error.

Specifically, the transmission data is converted by a serial/parallel converter and latched by latches into plural parallel data. A single arbitrary bit of the plural parallel data is fed to the convolutional encoder and 2-bit data outputted therefrom is separated into two 1-bit data. The remaining bits not inputted to the convolutional encoder are divided into two groups of remaining bits. One of the 1-bit outputted from the convolutional encoder is combined with one group of remaining bits to attain a 2-bit in-phase component. The remaining one of the 1-bit outputs from the convolutional encoder is combined with the other group of remaining bits to attain a 2-bit quadrature component. The in-phase and quadrature components thus obtained are supplied to the signal point generator.

On the receiving apparatus, metric items are assigned according to bits defined by outputs from the convolutional encoder on the transmission apparatus and Viterbi decoding is conducted using the metric items to produce correct reception data.

The configuration above requires only one convolutional encoder used for encoding with error correction in the transmitting apparatus.

In this situation, plural bit parallel data, such as, for example, 3-bit parallel data, created by the serial/parallel converter and latches is inputted as 4-bit parallel data to the signal point generator by using one convolutional encoder. The coding rate is therefore ¾.

Assuming, for example, that the data transmission rate of convolutional-coded data on the transmission path is 54 Mbit/s. Data is transmitted at a transmission rate of 54 Mbit/s×¾=40.5 Mbit/s in terms of transmission data before convolutional conversion in accordance with the present invention. This is considerably higher than 27 Mbit/s of the system shown in FIG. 6. In the same bandwidth and in the same modulation system, the present invention brings about quite a high data transmission rate. Transmission efficiency is therefore improved.

Now, an embodiment of the present invention will be described by referring to the drawings. In the drawings, the same constituent components are assigned with the same reference numerals.

Figure 8:
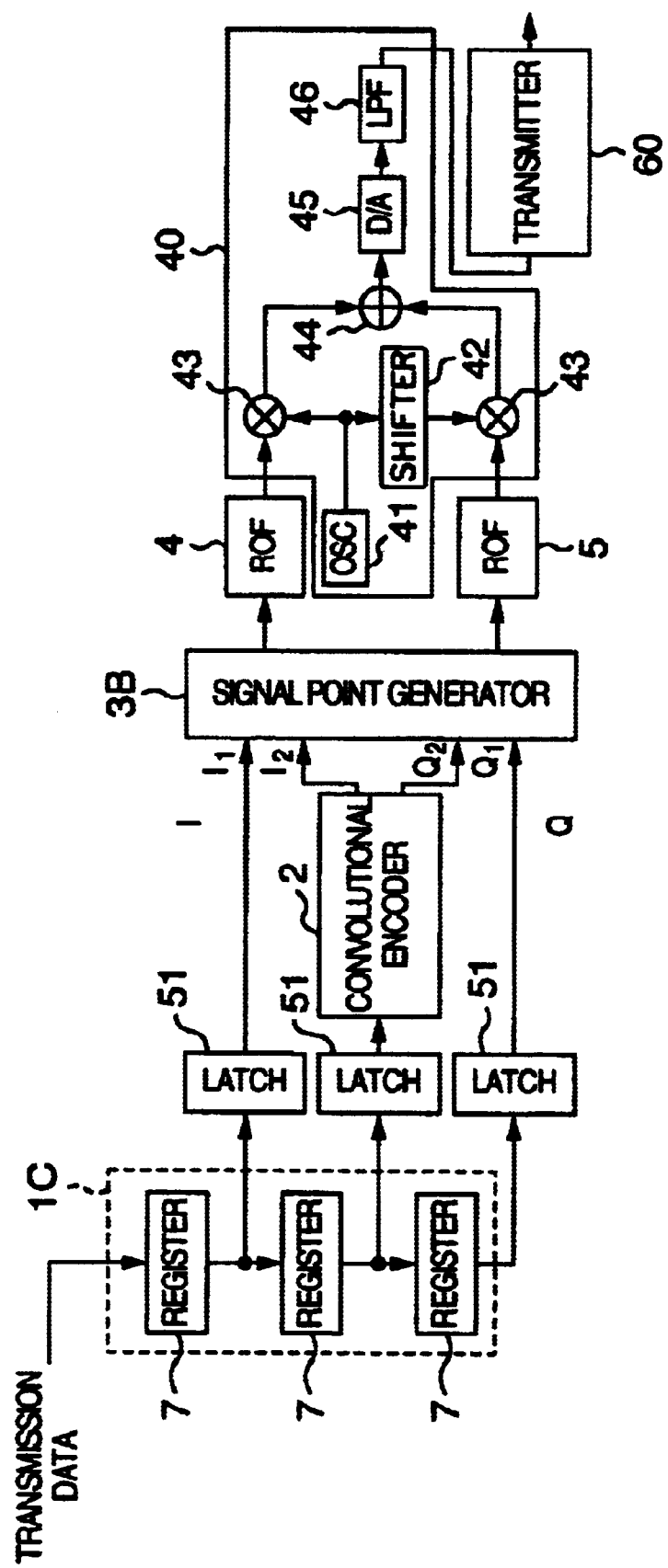
FIG. 8 is a block diagram showing constitution of a data transmitter section including an embodiment of an encoder having an error correcting function in accordance with the present invention.

FIG. 8 shows in a block diagram an embodiment of a data transmitting unit including an encoder having an error correcting function in a transmission system using 16 QAM modulation in accordance with the present invention. The encoder having an error correcting function is not limited to the 16 QAM modulation. Namely, the encoder can be generally applied to any transmission system which uses $2^n$ QAM modulation (n is an integer equal to or more than 4).

In the configuration of FIG. 8, a serial/parallel converter 1C, latches 51, a convolutional encoder 2, a signal point generator 3B, roll off filters 4 and 5 constitute an encoder having error correcting function. The roll-off filters 4 and 5 may be included in a modulating section 40.

In operation of the system of FIG. 8, transmission data is received by the serial/parallel converter 1C including three registers 7 and is converted into a parallel signal of 3-bit length.

In general, the converter 1C produces parallel signal of (n−1)-bit (n is an even integer equal to or more than 4).

Output data from each register 7 is fed to the associated latch 51. Resultantly, parallel data of 3-bit length is produced.

One bit of the parallel data of 3-bit length is inputted to the convolutional encoder 2. The encoder 2 produces components I2 and Q2. Data not inputted to the encoder 2 is employed directly as components I1 and Q1 as they are. Any bit of the data may be inputted to the convolutional encoder 2. In the embodiment, a central bit of the data is inputted to the convolutional encoder 2.

Figure 9:
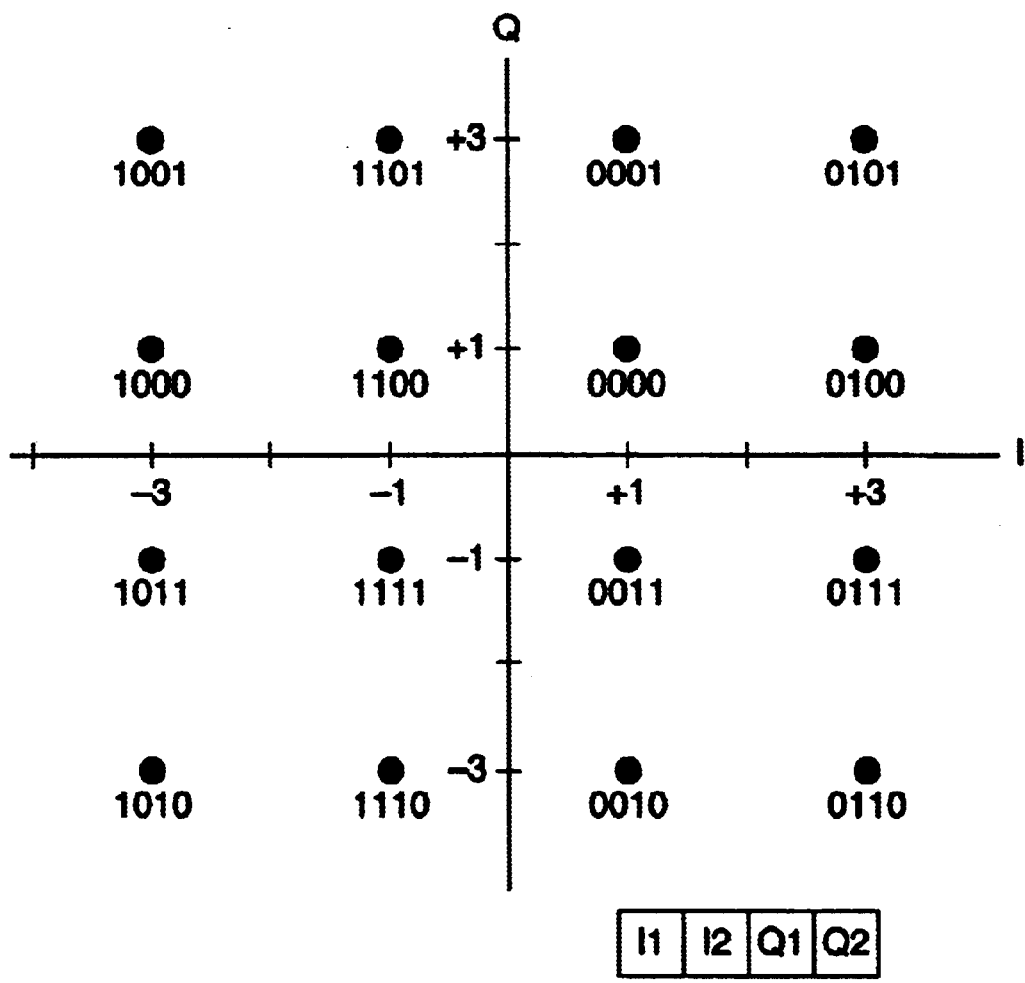
FIG. 9 is a graph showing bit layouts of signal points on a constellation in the embodiment shown in FIG. 8.

In this example of 16 QAM system, regardless of the position of the bit in the parallel data, the output of the coder 2 are used as components I2 and Q2 in response to the bit received. This results in a combination of bit layouts as shown in FIG. 9 which are assigned to respective signal. The 2-bit data not inputted to the encoder 2 may be arbitrarily assigned to the components I1 and Q1. In that case, however, the order of signals inputted to a parallel/serial converter 28 in a decoding section of FIG. 12, which will be described later, must be correspondingly configured so that the serial transmission data of FIG. 8 is outputted via the converter 28 in the original sequence.

The components I1 and I2 are combined with each other as an in-phase component and the components Q1 and Q2 are combined with each other as a quadrature component. The respective components are fed to a signal point generator 3B.

The generator 3B has the bit layouts of signal points on a coordinate system of in-phase amplitude components (I) and quadrature amplitude components (Q) as shown in FIG. 9. Rules to define bit layouts are stipulated as below.

(1) In-phase components I1 and I2
For signal points having the same amplitude components, same bit values are assigned to the components I1 and I2 independently of quadrature components (Q). For example, when the amplitude component level is +3 on the I-axis, the components I1 and I2 are assigned with values of 0 and 1, respectively; when +1, the components I1 and I2 are assigned with the values of 0 and 0, respectively; when −1, the components I1 and I2 are assigned with the values of 1 and 1, respectively; and when −3, the components I1 and I2 are assigned with the values of 1 and 0, respectively.

(2) In-phase component I2
For the component I2, values 0 and 1 are alternately assigned to adjacent signal points with respect to amplitude component level on the I-axis. That is, adjacent signal points are assigned with mutually different bit values. For example, in connection with (1) above, when the amplitude component level is +3 on the I-axis, the component I2 is assigned with the value 1; when the level +1, namely, at the adjacent amplitude component level is +1, the component I2 is assigned with the value 0; when −1, namely, at the adjacent amplitude component level is −1, the component I2 is assigned with the value 1; and when −3, namely, at the adjacent amplitude component level is −3, the component I2 is assigned with the value 0.

(3) Quadrature components Q1 and Q2
For signal points of the same amplitude components, same bits are assigned to the components Q1 and Q2 independently of in-phase components (I). For example, when the amplitude component level is +3 on the Q-axis, the components Q1 and Q2 are assigned with values of 0 and 1, respectively; when the level +1, the components Q1 and Q2 are assigned with the values of 0 and 0, respectively; when the level −1, the components Q1 and Q2 are assigned with the values of 1 and 1, respectively; and when the level −3, the components Q1 and Q2 are assigned with the values of 1 and 0, respectively.

(4) Quadrature component Q2
For the component Q2, values 0 and 1 are alternately assigned to adjacent signal points with respect to amplitude component level on the Q-axis. That is, adjacent signal points are assigned with mutually different bit values. For example, in connection with (3) above, when the amplitude component level is +3 on the Q-axis, the component Q2 is assigned with the value 1; when the level +1, namely, at the adjacent amplitude component level is +1, the component Q2 is assigned with the value 0; when the level −1, namely, at the adjacent amplitude component level is −1, the component Q2 is assigned with the level 1; and when −3, namely, at the adjacent amplitude component level is −3, the component Q2 is assigned with the value 0.

Assume that n/2 bit signal (n: an even integer equal to or more than 4) are assigned to each of the in-phase components (I) and further the quadrature components (Q), namely, two bits are assigned to each of the in-phase and quadrature components as in the embodiment. The bit layouts are defined in a signal point plane of an I-Q coordinate system as below.

(1) An identical bit layout is assigned to in-phase components at signal points having an identical in-phase amplitude component and an identical bit layout is assigned to quadrature components at signal points having an identical quadrature amplitude component (the bit layout is independently assigned between the in-phase components and the quadrature components, that is, mutually different bit layouts are assigned).

(2) For signal points adjacent to each other in the in-phase amplitude component axis, mutually different bit values (0 and 1) are alternately assigned to in-phase component bits corresponding to the in-phase component output from a convolutional encoder.

For signal points adjacent to each other in the quadrature amplitude component axis, mutually different bit values (0 and 1) are alternately assigned to bits corresponding to the quadrature component output from a convolutional encoder.

In response to received data of the components I1, I2, Q1, and Q2, the signal point generator 3B produces each of in-phase and quadratury amplitude components of a signal point thus defined and sends the amplitude components to the roll-off filters 4 and 5.

Assuming, for example, that the components I1, I2, Q1, and Q2 are represented as 1, 0, 0, and 0, respectively. The signal point is determined as (−3,+1) and a signal of in-phase amplitude component level of "−3" is fed to the roll-off filter 4 and a signal of quadrature amplitude component level of "+1" is fed to the roll-off filter 5.

The filters 4 and 5 sends respective outputs to a transmission processing system to generate a transmission signal using the outputs. The transmission processing system includes a modulating section 40 and a transmitter section 60. The modulating section 40 receives from the roll-off filters 4 and 5 the in-phase amplitude component (I) signal and the quadrature amplitude component (Q) signal which are in a parallel signal form and of which waveforms are shaped. To modulate the (I) and (Q) signals by multipliers 43, a digital sine waveform generator 41 supplies a modulation wave signal, namely, a sine wave signal $\cos(\omega c \cdot t)$ having a frequency of fc. The sine wave signal is fed through a phase shifter 42 having a shifting factor of $\pi/2$ to obtain a sine wave of $\cos(\omega c \cdot t)$ shifted by $\pi/2$, that is $\sin(\omega c \cdot t)$. The (I) signal is modulated by a multiplier 43 using a sine wave of $\cos(\omega c \cdot t)$ and the (Q) signal is modulated by a multiplier 43 using a sine wave of $\sin(\omega c \cdot t)$. The signals resulted from the modulation are added to each other by an adder 44 to generate a sum of the signals. The generated sum signal is converted by a digital/analog (D/A) converter 45 from a digital signal into an analog signal. The converted analog signal is then passed to an analog low-pass filter 46. The filter 46 removes an aliasing component caused by the sampling from the analog signal. A signal thus obtained is outputted as a modulated wave signal. The outputted signal is fed to the transmitter section 60 and is processed through known operations such as power amplification. The processed signal is resultantly converted into a transmission signal.

Next, description will be given of another embodiment of a decoder having an error correcting function of a receiving apparatus in accordance with the present invention. The above decoder is associated with a $2^n$ QAM system in which n is an even number as in the configuration of FIG. 8.

Figure 10:
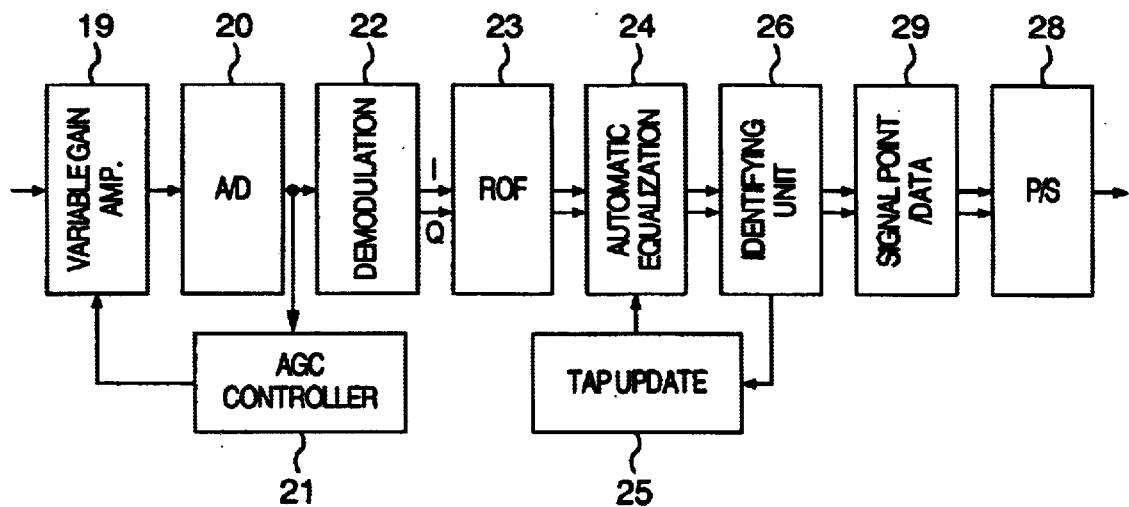
FIG. 10 is a block diagram showing an example of structure of a receiving apparatus section in a multilevel modulation system not including an error correcting function.

For simplicity of understanding, description will be given of a function on a reception apparatus side in the case where the error correction is not carried out as shown in FIG. 10. A signal received is supplied to a variable gain amplifier 19. Under control of an automatic gain control (AGC) controller 21 connected to an output port of an A/D converter 20, the signal is fed to the A/D converter 20 with a fixed reception level adjusted by the controller 21.

The A/D converter 20 performs an analog to digital conversion on the signal to produce an output digital signal. The output digital signal is fed through a demodulator 22, a roll-off filter 23 to shape waveforms, and an automatic equalizer 24 to equalize distortion of signals caused by the transmission system to an identifying unit 26 where a signal point is identified based on the inputted signal thereto.

According to the result of the identification, a signal point/data converter 29 decodes transmission data.

The decoding section 22 receives digital signals from the A/D converter 20 and demodulates the signal by amplifiers. Specifically, a sine wave signal which is produced by a digital sine wave generator, not shown, and which has a frequency of the modulated wave signal is multiplied by a multiplier, not shown, by the digital signal to obtain a demodulated in-phase component (I) signal. On the other hand, the digital sine wave signal is shifted by $\pi/2$ and is multiplied by a multiplier by the digital signal to obtain a demodulated quadrature component (Q) signal. The resultant (I) and (Q) signals are obtained as a parallel signal.

In the decoding at the signal point/data converter 29, for each signal point generated by a signal point generator (e.g., a signal point generator 3B of FIG. 8) on the transmission apparatus side, bits defined for each signal point are restored. Therefore, the parallel signal obtained here is fed to a parallel/serial converter 28 to be converted into a serial signal. The serial signal is outputted as a reception signal.

The identifying unit 26 supplies a result of identification to a tap update unit 25. The unit 25 updates tap assignment of the automatic equalizer 24. Resultantly, the equalizer 24 carries out an equalizing operation suitable for transmission characteristics.

Figure 11:
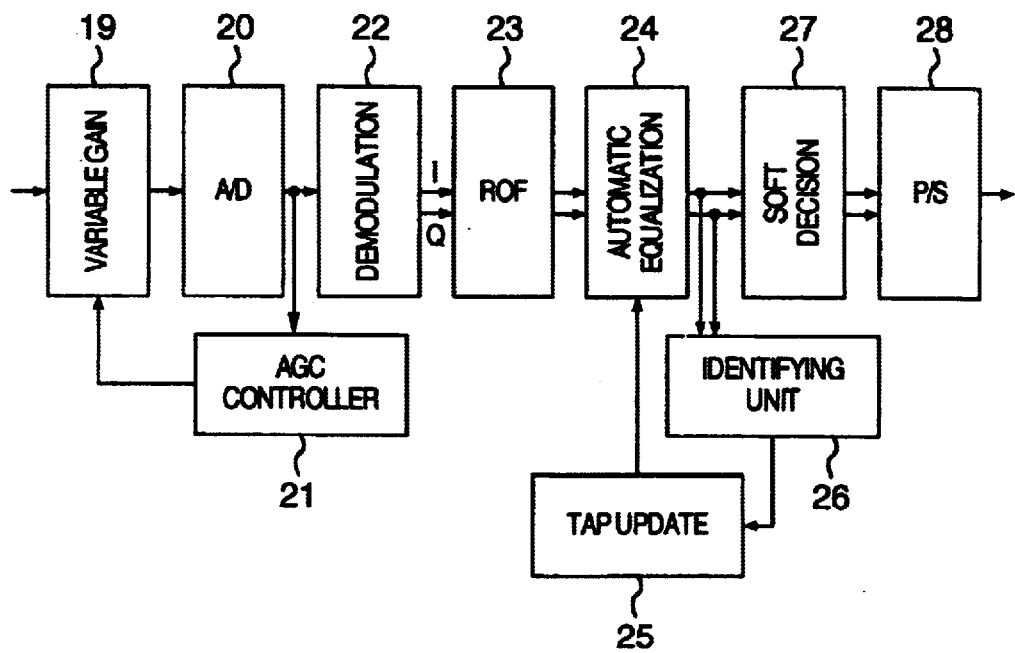
FIG. 11 is a block diagram showing structure of an embodiment of a receiving apparatus section of a multilevel modulation system including an error correcting function in accordance with the present invention.

FIG. 11 shows constitution of an embodiment of a data receiver including an error correcting function in accordance with the present invention.

In the case where an error correcting function is included, the automatic equalizer 24 sends its output concurrently to the identifying unit 26 and a soft decision decoder 27.

In the configuration, like in FIG. 10, the identifying unit 26 supplies a result of identification to the tap updating unit 25 to update tap assignment of the automatic equalizer 24. Therefore, the equalizer 24 conducts an equalizing operation suitable for transmission path characteristics.

In addition, the soft decision decoder 27 outputs transmission data in parallel in which errors have been corrected and of which data has been decoded to the parallel/serial converter 28. In response thereto, the converter 28 produces a serial signal and outputs the signal as a reception signal.

The soft decision decoder section 27 will be described in detail by referring to FIG. 12.

Figure 12:
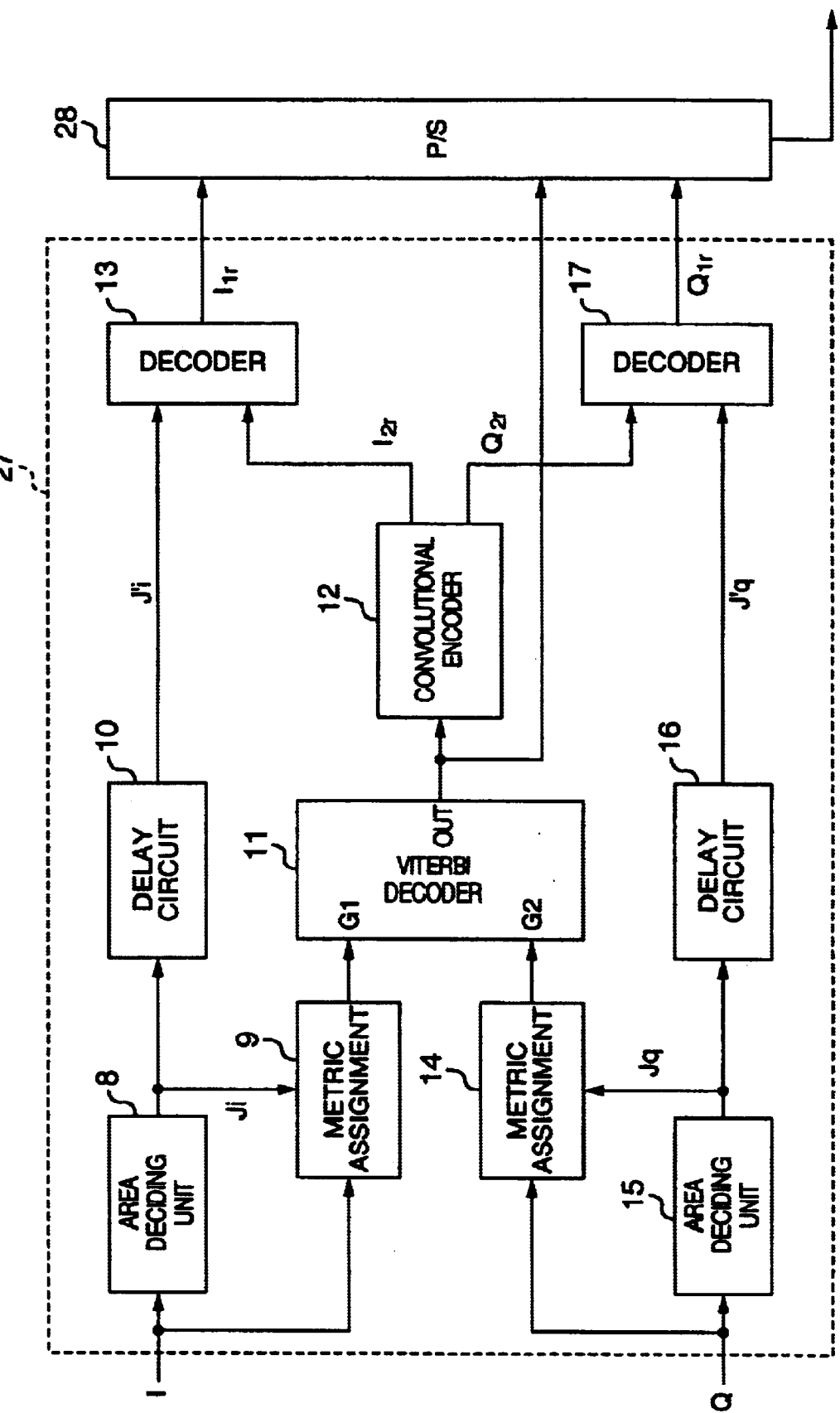
FIG. 12 is a block diagram showing a configuration example of a decision decoder section in the receiver section shown in FIG. 11.

As shown in FIG. 12, the soft decision decoder section 27 receives an (I) signal and a (Q) signal from the automatic equalizer 24 in the preceding stage. The (I) and (Q) signals are fed to area decision units 8 and 15, respectively.

In some cases, the signal points sent from the transmission apparatus side cannot be reflected on the appropriate signal points on the coordinate system of signal points on the reception apparatus side because of influence of distortion and noise on the transmission path. As can be seen from FIG. 13, an error may occur in the transmitted signal, the error being represented by a positional deviation from ● marked position (+1, +3) to x marked position.

Figure 13:
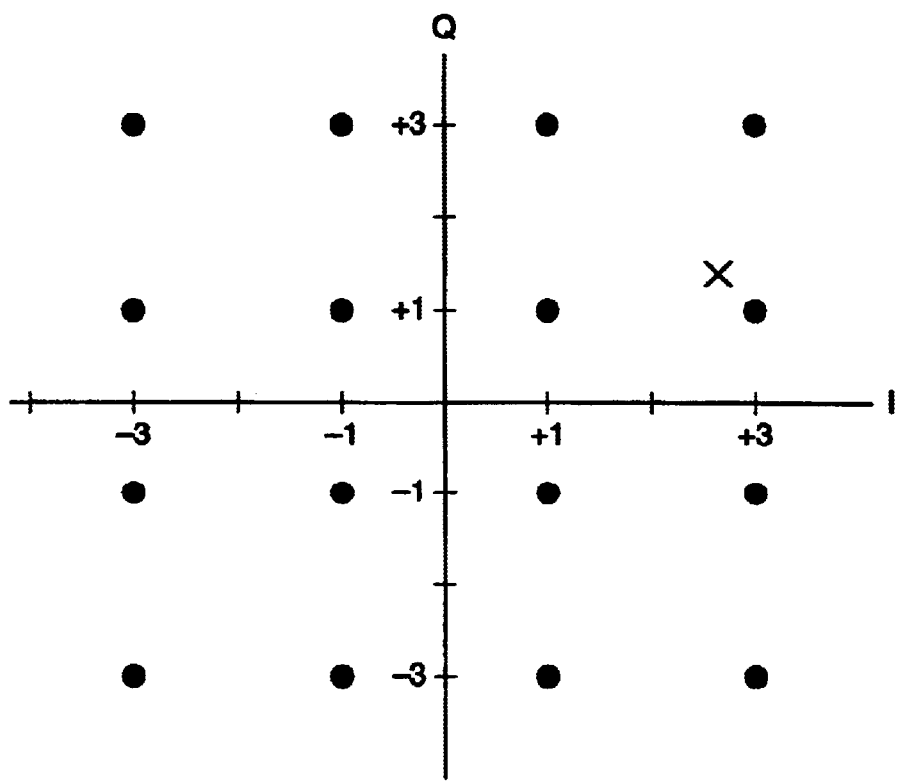
FIG. 13 is a graph showing bit layouts of signal points on a constellation to explain operation of the decoder section shown in FIG. 12.

In FIG. 13, the coordinate of a signal point, for example, (+1,+3) sent from the transmission apparatus side is undesirably shifted to a signal point indicated by "X" in data received on the reception apparatus side. In the embodiment, this error is corrected and a correct output signal is reproduced. That is, as already described for the operation of the signal point generator 3B shown in FIG. 8, the bit layouts are completely independently defined between the I-axis and the Q-axis. This allows independent correction of any error in the demodulation.

Figure 14:
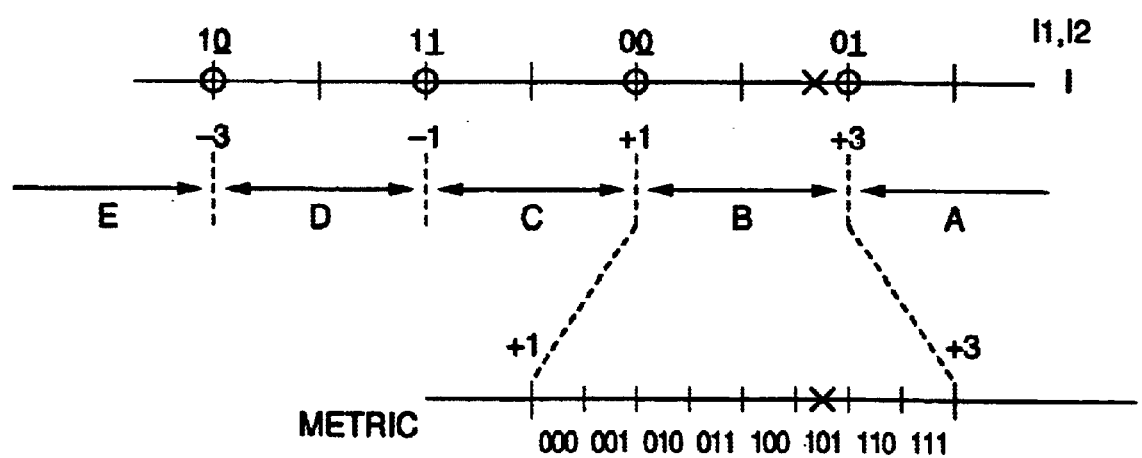
FIG. 14 is a graph showing metric assignment to explain operation of the decoder section shown in FIG. 12.

FIG. 14 shows a signal point of reception data marked by "X" in FIG. 13 when viewed only along the I-axis.

In, FIG. 14, the signal point plane of the in-phase amplitude component (I)-quadrature amplitude component (Q) coordinate system of FIG. 13 is divided into areas A to E along the in-phase amplitude component I-axis. Assuming that an area exceeding an in-phase amplitude component of +3 is called area A. Similarly, an area from the level +3 to the level +1 is called area B, an area from the level +1 to the level −1 is called area C, an area from the level −1 to the level −3 is called area D, and an area beginning at −3 is called area E. Although not shown, areas are also defined along the quadrature amplitude component Q-axis.

The area decision unit 8 desides to which one of the areas A to E (FIG. 14) the received signal point belongs. A result of decision Ji is fed to a metric assignment unit 9.

The unit 9 also receives an I-axis amplitude component signal of the signal supplied from the automatic equalizer 24. Using the decision result Ji and the I-axis amplitude component signal, the metric assignment unit 9 obtains a value of information of certainty, a metric item necessary for the Viterbi encoding. The value is delivered to an G1 terminal of a Viterbi decoder 11.

In this description, the Viterbi decoder 11 is, for example, the Viterbi decoder available on the market with a type "STEL-2060/CR" employed as the Viterbi decoder 107 in FIGS. 3A and 3B. In the STEL-2060/CR, 3-bit data obtained by equally dividing a distance between signal points is used as metric to be supplied to the G1 terminal.

In the example of FIG. 14, in the case where the received signal point is as described above, deciding that the signal point is in area B, a distance from the amplitude component level from +3 to +1 is equally divided by 8 to assign a metric item.

In this situation, 0, 1 are assigned to the values of bits I1 and I2 for the level +3 as shown in FIG. 9 and 0, 0 are assigned to the values of bits I1 and I2 for the level +1.

A bit defined for the output signal I2 from the convolutional encoder 2 on the transmission apparatus side is assigned to the value 1 for the level +3 and assigned to the value 0 for the level +1.

Metric items supplied to the Viterbi decoder 11 are defined as 111, 110, 101, 100, 011, 010, 001, and 000 for a range from level 1 to level 0.

A metric item corresponding to the received signal point needs only be inputted to the G1 terminal of the Viterbi decoder 11 according to the definition. The metric item is 101 in the example of FIG. 14.

This also applies to a case in which a signal point is received in area C or D. A metric item selected from metric items defined in a sequential order within a range from level 1 to level 0 need only be fed to the GI terminal of the Viterbi decoder 11.

In the case where a signal point is received in area A, the metric item need only set to 111. In the case where a signal point is received in area E, the metric item need only set to 000.

This is inferred because that in the case where a signal point is received in area A, it is quite probable that the signal point sent from the transmission apparatus side has an (I) amplitude component level of +3. Similarly, in the case where a signal point is received in area E, it is quite probable that the signal point sent from the transmission side has an (I) amplitude component level of −3.

The reason of such inference is because noise on the transmission path has intensity having a Gauss distribution. That is, probability of occurrence of an error becomes higher in the proximity of the transmitted signal point. As a distance from the signal point increases, probability of occurrence of an error becomes lower.

This is also the case with the quadrature amplitude component Q-axis. For a quadrature amplitude component level of +3, the values of the bits Q1 and Q2 are 0 and 1, respectively; for a quadrature amplitude component level of +1, the values of the bits Q1 and Q2 are 0 and 0, respectively; and for a quadrature amplitude component level of −3, the values of the bits Q1 and Q2 are 1 and 0, respectively. Therefore, according to the decision result Jq from the decision unit 15 and the quadrature amplitude component signal, it is only necessary that the metric assignment unit 14 assigns an metric item according to the received signal point and supplies the metric item to the G2 terminal of the Viterbi decoder 11 in the same way as for the in-phase amplitude component I-axis.

Using input signals from the G1 and G2 terminals, the Viterbi decoder 11 conducts the Viterbi decoding to output corrected data to an OUT terminal.

As a result, the signal from the OUT terminal is equivalent to the input signal to the convolutional encoder 2 on the transmission apparatus side shown in FIG. 8.

The corrected signal is fed from the OUT terminal to the convolutional encoder 12. The encoder 12 is equal in constitution to the convolutional encoder 2 on the transmission apparatus side of FIG. 8. That is, the encoder 12 produces outputs I2r and Q2r which are respectively equal to the outputs I2 and Q2 from the encoder 2 on the transmission apparatus side.

The outputs I2r and Q2r are delivered to decoders 13 and 17, respectively. To the decoders 13 and 17, the decision results Ji' and Jq' are also inputted respectively via delay circuits 10 and 16 respectively from the area deciding units 8 and 15.

The delay circuits 10 and 16 provide delay time equal to that required for the respective OUT signals from the Viterbi decoder 11.

Assume that the decision result Ji from the area deciding unit 8 indicates, for example, area B.

Data representing area B is fed via the delay circuit 10 to the decoder 13. In this connection, the data representing area B is also delivered to the Viterbi decoder 11 and is decoded. The decoded signal is then encoded by the convolutional encoder 12 to be fed as an output I2r to the decoder 13. Because of the delay circuit 10, the data are simultaneously inputted to the decoder 13. In response thereto, the decoder 13 produces an output I1r. Assuming in this situation in which the area decision result fed to the decoder 13 indicates area B that the output I2r from the convolutional encoder 12 is the value 0. As can be seen from the definition shown in FIG. 14, the bit I2 is the value 0 in area B for a signal point having an amplitude component level of +1.

Therefore, since the bits I1 and I2 are respectively the value 0 and the value 0 when the amplitude component level is +1, decoder 13 produces the output I1r of the value 0. The output I1r is correct data equivalent to the data I1 on the transmission apparatus side.

This also applies to the quadrature amplitude component Q-axis side. The decision result from the area deciding unit 15 is delayed by the delay circuit 16 for an internal delay time of the Viterbi decoding. Using the delayed signal and the signal Q2r from the convolutional encoder 12, the decoder 17 produces an output Q1r in the same manner as for the in-phase amplitude components on the I-axis side. The data Q1r is equivalent to the signal Q1 on the transmission apparatus side.

In the description above, the signal point sent from the transmission apparatus side can be estimated as (+1,+3) using the in-phase amplitude component and the quadrature amplitude component to obtain a correct signal point without any error. Returning to FIG. 12, when the signal from the OUT terminal of the Viterbi decoder 11, the signals I1r and Q1r respectively from the decoders 13 and 17 are supplied to the parallel/serial converter 28, correct serial data equal to the transmission data can be obtained.

Figure 15:
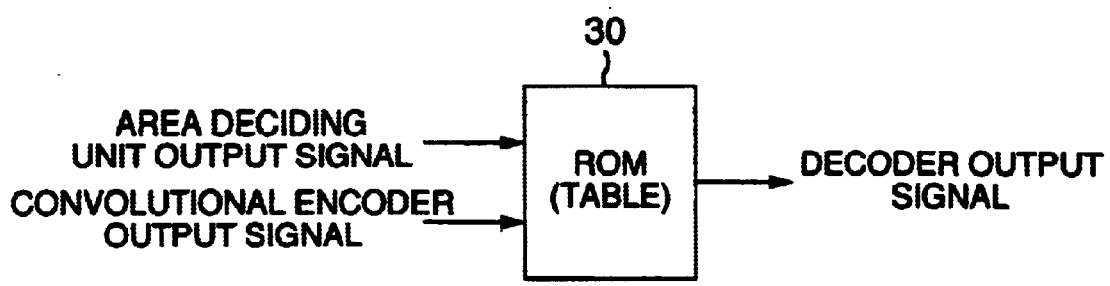
FIG. 15 is a block diagram showing an example of a decoder in the decoding section shown in FIG. 12.

The decoders 13 and 17 assign various bits depending on areas to which the bits are assigned. It is therefore simple and desirable to implement the decoder using a read-only memory (ROM) table, for example, as shown in FIG. 15. That is, the outputs from the area deciding units 8 and 15 and the outputs from the convolutional encoder 12 are allocated to addresses of an ROM 30. On the other hand, the output data is beforehand written at the respective addresses of the ROM 30. In this configuration, when a signal is received, a decoded item corresponding to the signal can be easily obtained from the table.

The embodiment of the application of the 16 QAM system has a coding rate of ¾. When compared with the coding rate of ½ in the configuration shown in FIG. 6, the embodiment leads to a sufficiently high data transmission rate.

The embodiment requires only one convolutional encoder 2 on the transmission apparatus side, without counting on the reception apparatus side and only one Viterbi decoder on the reception apparatus side. In short, one convolutional encoder and only one Viterbi decoder suffice to process the I-axis and Q-axis components. This reduces the circuit size and the system cost.

In the embodiment, the convolutional encoder and the Viterbi decoder are available in the market. The constituent components are easily available in the market and accordingly the system cost is lowered.

Description will now be given of another embodiment of the present invention by referring to FIGS. 16 and 17.

While the preceding embodiment is an application using the 16 QAM system, the present embodiment is applicable also to a 64 QAM system and a 256 QAM system. For example, FIG. 16 shows a configuration on the transmission apparatus side in an application of the 64 QAM system. The configuration of constituent components subsequent to roll-off filters 4 and 5 is the same as that of FIG. 8 and hence will not be shown.

Figure 16:
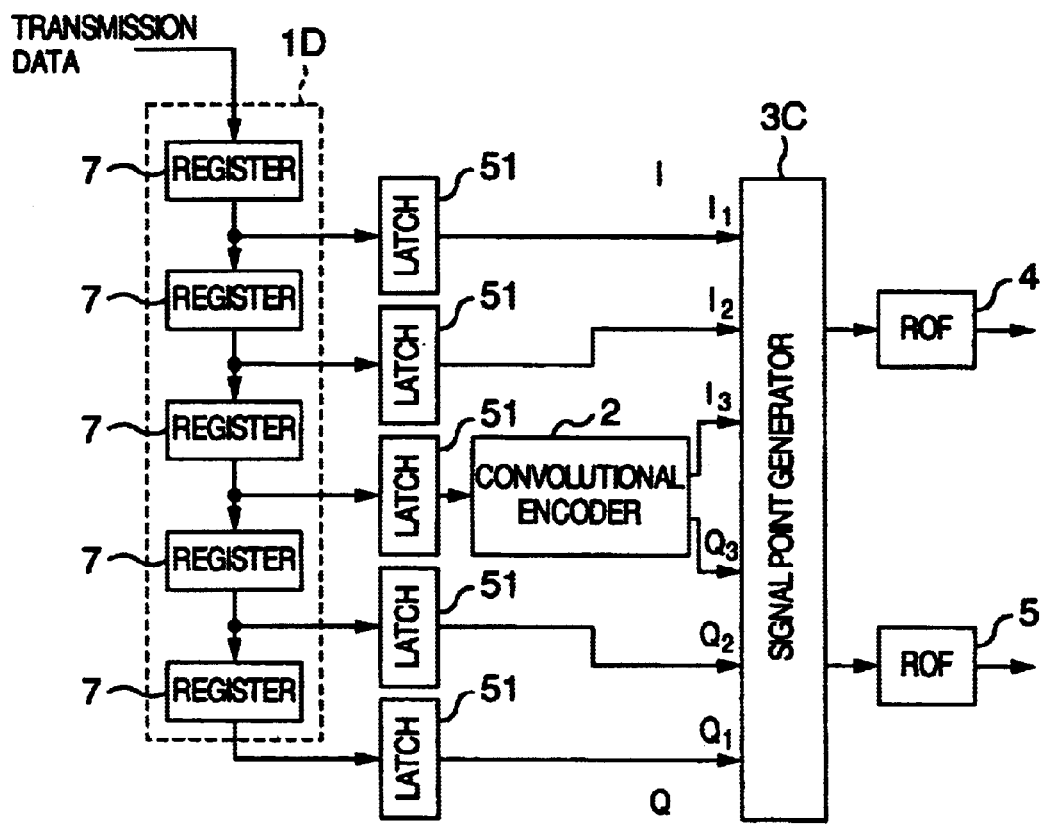
FIG. 16 is a block diagram showing constitution of another embodiment of a coder having an error correcting function in accordance with the present invention.

In the 64 QAM system of FIG. 16, a combination of a serial/parallel converter 1D and latches 51 converts transmission data into 5-bit parallel data.

One bit, for example, a central bit of the 5-bit data is fed to a convolutional encoder 2. The encoder 2 produces an output I3 as a signal of the in-phase component (I) side and an output Q3 as a signal of the quadrature component (Q) side.

Bits I1 and I2 not fed to the encoder 2 and an output I3 from the encoder 2 form a 3-bit in-phase component (I), which is sent to a signal point generator 3C. Similarly, bits Q1 and Q2 and an output Q3 from the encoder 2 constitute a 3-bit quadrature component Q, which is also sent to a signal point generator 3C.

Besides, any bit of the data may be inputted to the convolutional encoder 2. In the embodiment, a central bit of the data is inputted.

Figure 17:
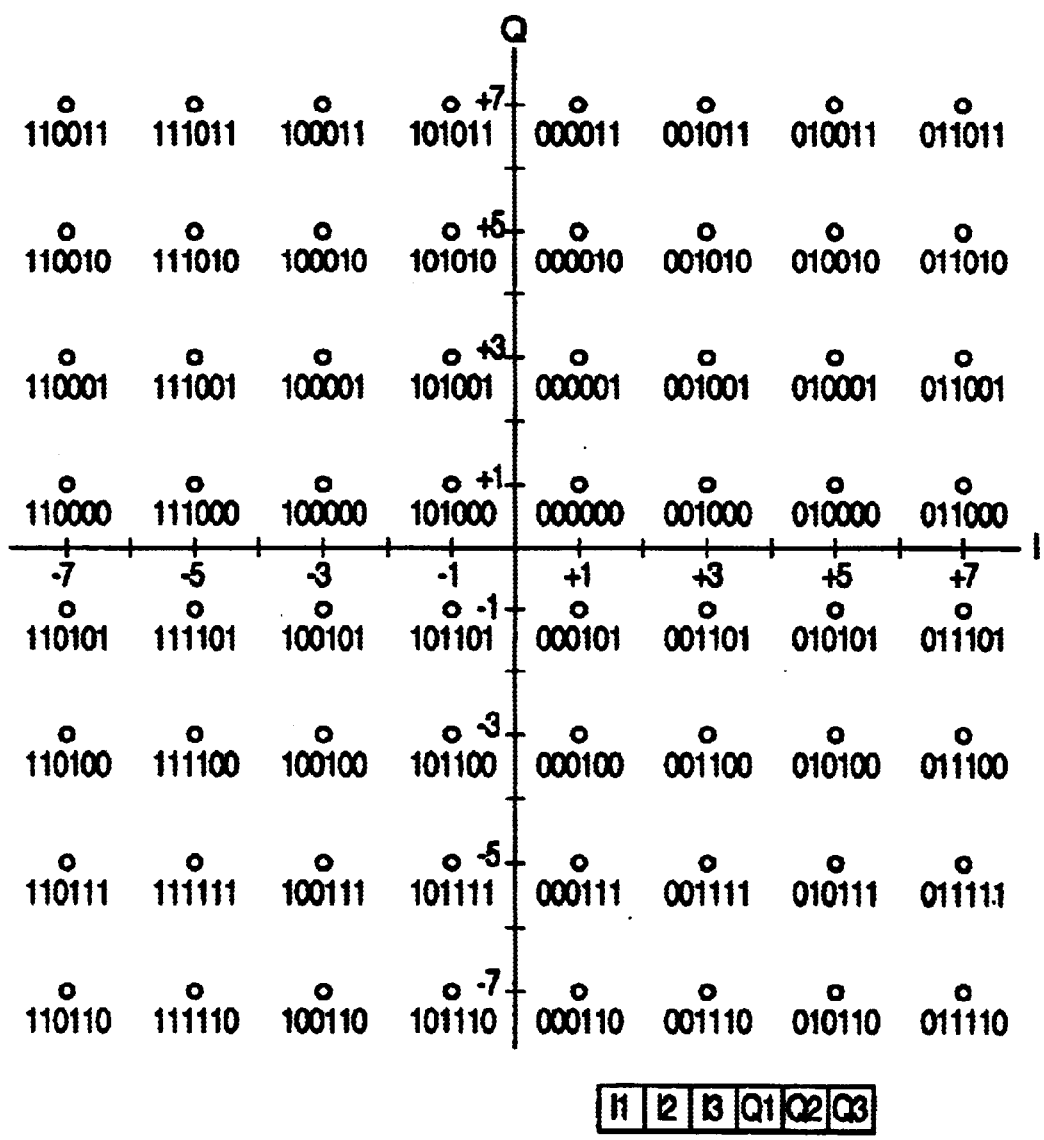
FIG. 17 is a graph showing bit layouts of signal points on a constellation in a 64 QAM system shown in FIG. 16.

In the signal point generator 3C, signal points are defined as shown in FIG. 17. Specifically, 64 signal points to be transmitted are defined for 6-bits input signals. FIG. 17 shows an example of definitions of 64 signal points, that is, 64 signal points are defined by a 3-bit in-phase component and a 3-bit quadrature component.

Using a 6-bit signals from the serial/parallel converter 1D and the convolutional encoder 2, the signal point generator 3C generates an I-axis amplitude component value and a Q-axis amplitude component value respectively corresponding to coordinate values of either one of the 64 signal points and inputs the I-axis amplitude components value and the Q-axis amplitude components value respectively to the roll-off filters 4 and 5.

In the definition of the signal point generator 3C, the I-axis amplitude component value and the Q-axis amplitude component value are mutually independently defined for 64 signal points. For example, for the signal points each of which has an I-axis amplitude component level of +7, i.e., (+7,+7), (+7,+5), (+7,+3), (+7,+1), (+7,−1), (+7,−3), (+7,−5), and (+7,−7); the input bits I1, I2 and I3 are defined as "011". For the signal points each of which has an I-axis amplitude component level of +5, the input bits I1, I2 and I3 are defined as "010". For the signal points each of which has an I-axis amplitude component level of +3, the input bits I1, I2 and I3 are defined as "001".

On the Q-axis side, for signal points having an identical Q-axis amplitude component value, same input bits are defined. For example, for the signal points each of which has an Q-axis amplitude component level of +7, i.e., (+7,+7), (+5,+7), (+3,+7), (+1,+7), (−1,+7), (−3,+7), (−5,+7), and (−7,+7); the input bits Q1, Q2 and Q3 are defined as "011". This is also the case with other Q-axis amplitude component level.

By independently defining the amplitude components respectively of the I-axis and Q-axis, the in-phase component signal and the quadrature component signal received can be decoded independently with respect to the I-axis and Q-axis on the reception apparatus side.

One bit of the in-phase component signal outputted from the convolutional encoder 2, specifically, one bit defined as a least-significant bit in the example is defined to be assigned such that 0 and 1 are alternately assigned to the associated signal points.

In short, the basic idea of definition of the bit layouts on the constellation plane of the signal point generator 3C is the same as that of the 16 QAM system as below.

(a) In-phase components I1, I2, and I3

For an identical amplitude component level, same component value are assigned to components I1, I2, and I3 independently of the quadrature components Q.

(b) In-phase component I3

For signal points adjacent to each other along the I-axis, 0 and 1 are alternately assigned to component I3.

(c) Quadrature components

For an identical amplitude component level, same component value are assigned to components Q1, Q2, and Q3 independently of the in-phase components Q.

(d) In-phase component Q3

For signal points adjacent to each other along the Q-axis, 0 and 1 are alternately assigned to component Q3.

In the bit layout definition for signal points on the constellation plane, 0 and 1 are alternately assigned to bit I3 for adjacent signal points as in the 16 QAM system shown in FIG. 14. Therefore, when bit I3 is reproduced through the area decision and the Viterbi decoding on the reception apparatus side, it is similarly possible to estimate bits I1 and I2.

Consequently, by achieving a similar operation also for the quadrature component (Q) on the reception apparatus side, correct reception data without any error can be produced using the outputs from the respective decoders and the output from the Viterbi decoder.

The embodiment of the 64 QAM system has a coding rate of 5/6 and hence leads to quite high data transmission efficiency.

Also in the embodiment, to process both of the I-axis and Q-axis components, only one convolutional encoder is required on the transmission apparatus side, without counting on the reception apparatus side and only one Viterbi decoder is required on the reception apparatus side. This minimizes the circuit size. Further, the Viterbi decoder is available on the market. That is, the constituent component is easily available on the market and accordingly the system cost is lowered.

In the case where the present invention is applied to a 256 QAM system, the bit layouts on the constellation plane of the signal point generator can be conducted in almost the same way as for those of the 64 QAM system. The configuration requires only one convolutional encoder on the transmission apparatus side, without counting on the reception apparatus side and only one Viterbi decoder on the reception apparatus side. In this case, the bit layouts need only be defined as follows.

The convolutional encoder produces bits I4 and Q4. Bits I1, I2, and I3 not fed to the convolutional encoder are combined with the output bit I4 to form an in-phase component to be inputted to the signal point generator. Bits Q1, Q2, and Q3 not fed to the convolutional encoder are combined with the output bit Q4 to form a quadrature component to be inputted to the signal point generator.

The embodiment of the application of the 256 QAM system has a coding rate of ⅞. This results in remarkable improvement of data transmission efficiency. Further, the embodiment, like the other embodiments, reduces the system cost.

Description will next be given of an embodiment of an encoder having an error correcting operation, a decoder having an error correcting operation, and a transmission apparatus using the encoder and decoder with a high coding rate in a transmission system. The transmission system includes an error correcting function of a $2^n$ QAM system, wherein n is an odd number.

In the embodiment, bit layouts are defined for divided areas in the constellation plane of the QAM system so that an error correction system like those of the embodiments above is used in a QAM system having an odd member n such as a 32 QAM system and a 128 QAM system.

Figure 18:
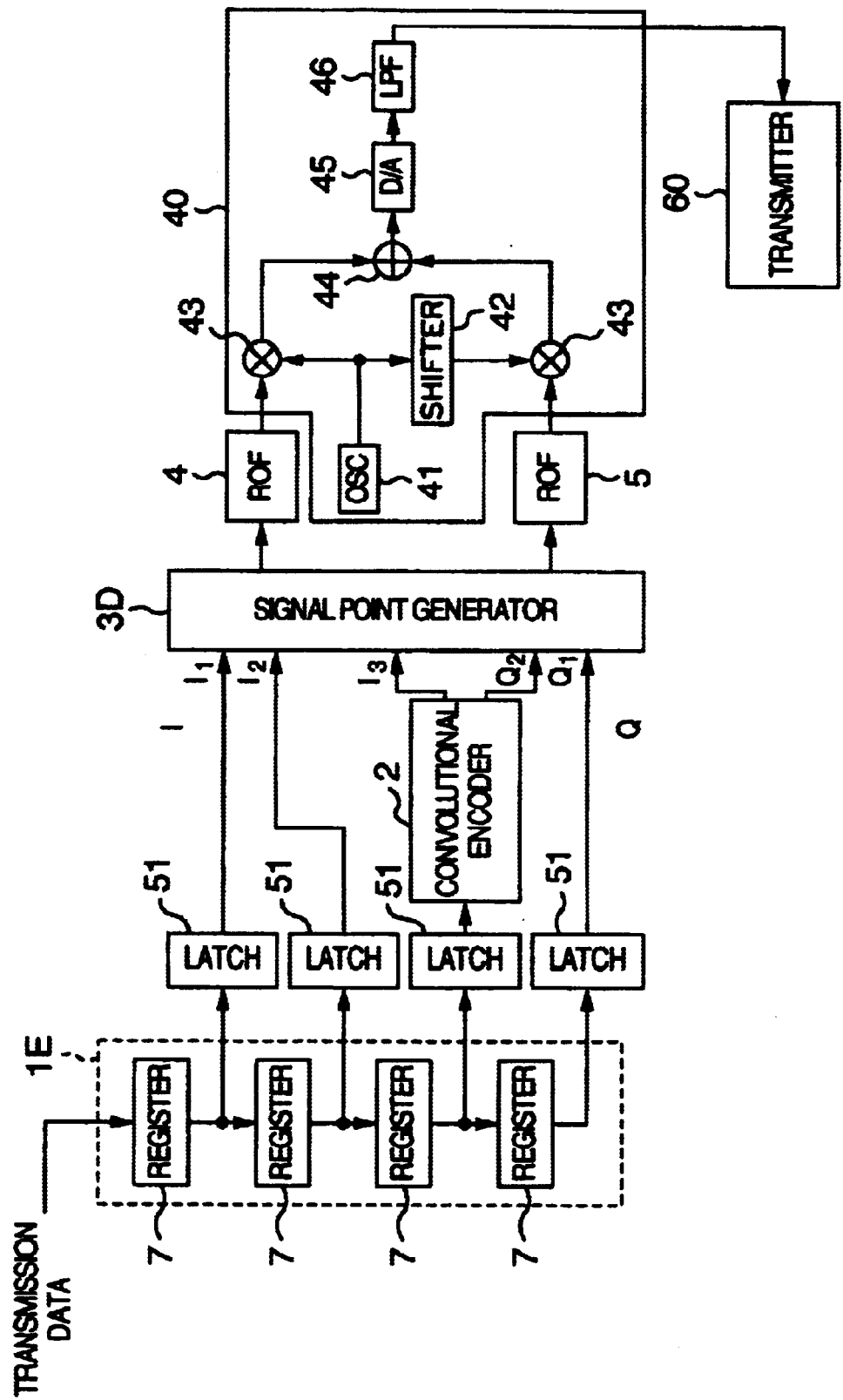
FIG. 18 is a block diagram showing constitution of another embodiment of a coder having an error correcting function in a transmission system using a 32 QAM system in accordance with the present invention.

FIG. 18 shows an embodiment of an encoder having an error correcting operation in a transmission system of a 32 QAM system, i.e., in a $2^n$ QAM system in which n is five.

The present invention is applicable not only to the 32 QAM system, but in general also to a $2^n$ QAM system (n is an odd number equal to or more than five).

In FIG. 18, transmission data is received by a serial/parallel converter 1E including four registers 7 and is converted into a 4-bit parallel signal.

In the general expression of $2^n$ QAM, the transmission data is generally converted into an (n−1)-bit parallel signal (n is an odd number equal to or more than five).

Every four bits of data from each register 7 are fed to the associated latchs 51. As a result, the output signals from the registers 7 are converted into 4-bit parallel data.

One bit of the 4-bit parallel data is first inputted to a convolutional encoder 2 to produce components I3 and Q2. Three remaining bits thereof are employed as components I1, I2, and Q1. As described in conjunction with FIG. 8, although any bit may be inputted to the encoder 2, a second bit of the data relative to a first position of the data from the converter 1E is fed to the encoder 2 in the embodiment.

These components are combined and the components I1, I2, and I3 and the components Q1 and Q2 are delivered to a signal point generator 3D.

Figure 19:
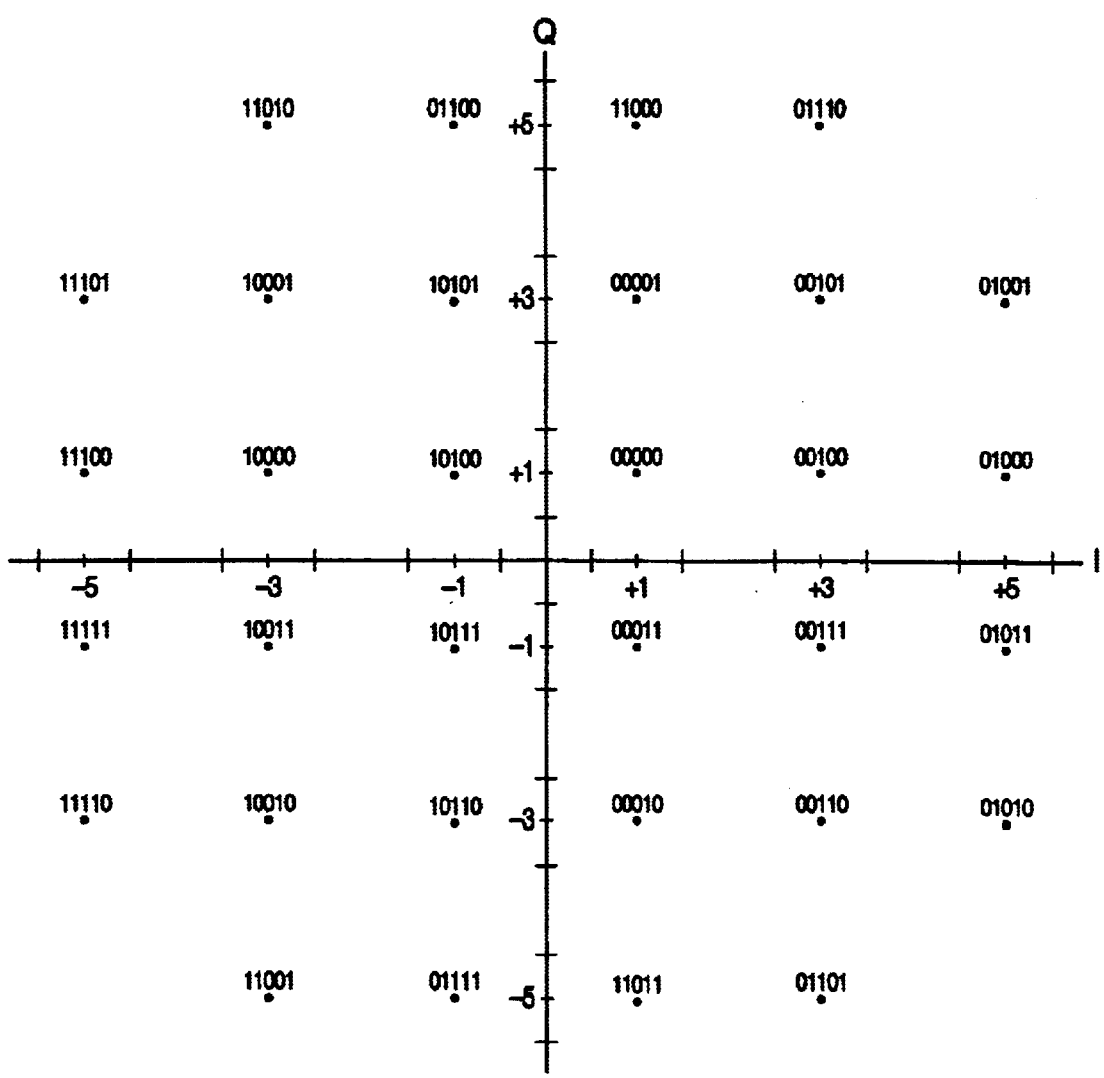
FIG. 19 is a graph to explain an example of bit layouts of signal points on a constellation in a 32 QAM system of the encoder shown in FIG. 1.
Figure 20:
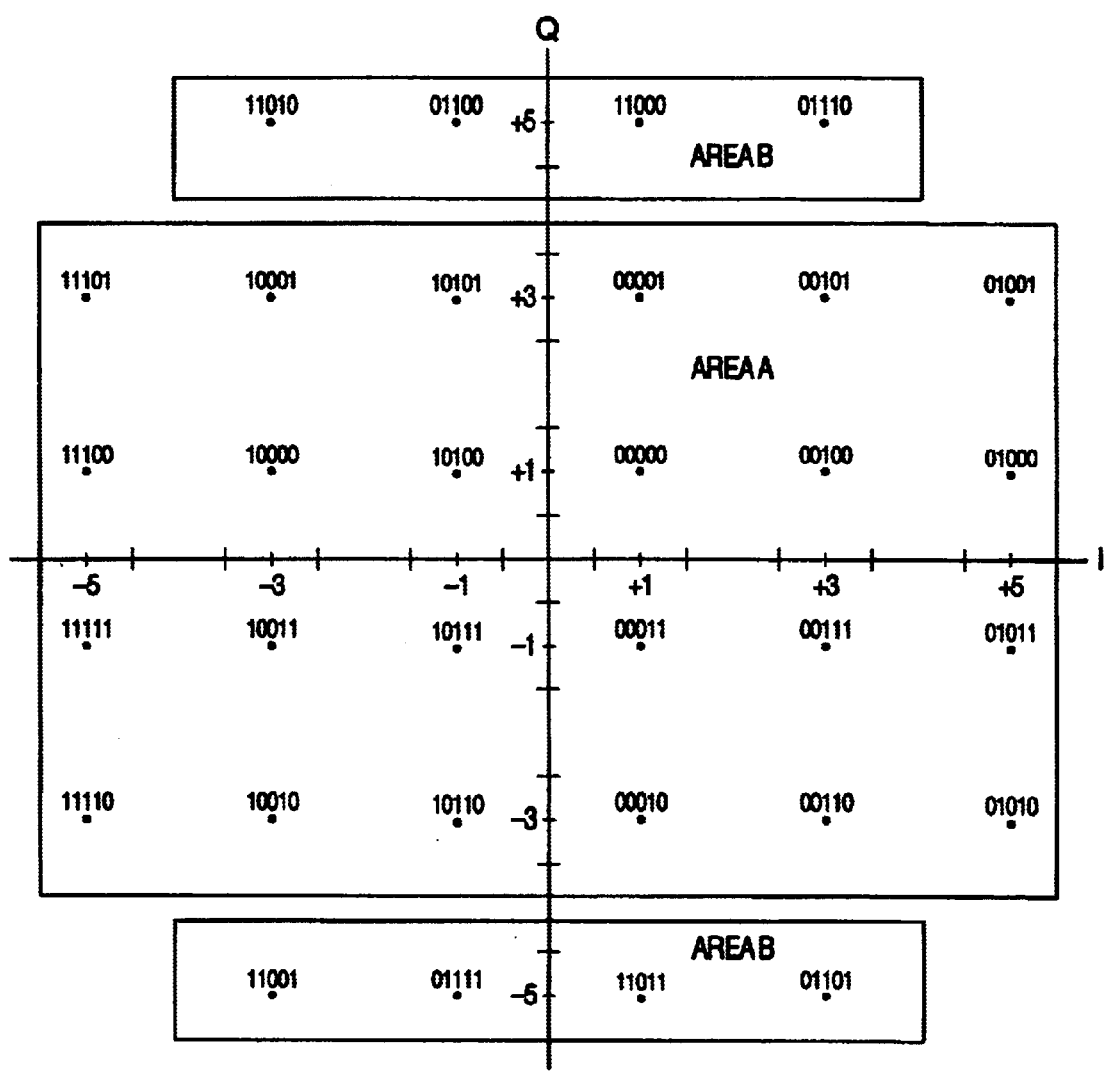
FIG. 20 is a graph to explain rules of bit layouts of signal points on a constellation of the embodiment of a 32 QAM system shown in FIG. 18.

In the generator 3D, bit layouts are defined for signal points as shown in FIG. 19. To define the bit layouts, $2^n$ bit layouts (32 layouts for n=5 in the embodiment) are assigned as follows. The signal points of FIG. 19 are decided after the constellation plane is divided into an area A and two areas B as shown in FIG. 20.

Note that in the area A components I1, I2 and I3 represent in-phase components and component Q1 and Q2 represent quadrature components. Therefore, the components I1, I2 and I3 will be referred to as in-phase components and components Q1 and Q2 will be referred to as quadrature components in the following both areas.

(1) According to the rules applied when n is an even number equal to or more than four, bit assignment is carried out for five bits in area A, i.e., for the in-phase components I1, I2, and I3 and the quadrature components Q1 and Q2. This results in definitions of 24 signal points. For all 32 signal points, the five bits must be assigned to the (I) and (Q) components without any duplication and without any non-assigned signal point.

(2) Bits are assigned to the eight remaining signal points in two areas B below.

(3) Basically, it is essential for appropriate Viterbi decoding that 0 and 1 are alternately assigned to adjacent signal points for components I3 and Q2 in areas B including boundaries between areas A and B (the boundaries directly relate only to the (Q) components in the embodiment).

(4) Then, bits are assigned to components I1, I2, and Q1. Bits not assigned to area A are assigned to components I1, I2, and Q1. In this case as well, the rule for area A (the same bit layout to the same component) is applied as far as same bit layout is available from the bit not assigned to the area A.

(5) In the case where any violation inevitably occurs in (4), bits are assigned to the components, while accepting the violation. This may lead to deterioration in performance, but the deterioration is in an allowable range. Note that bits must be assigned to all signal points without duplication and without non-assignment of bits to the signal points.

Specifically, bits are assigned to signal points in areas B as below. For components I1, I2, I3, Q1, and Q2, data bits must be assigned to 32 signal points without duplication. That is, data bit layouts other than those used in area A are used for eight points in areas B. First of all, for components I3 and Q2, 0 and 1 must be alternately assigned to adjacent signal points. For the remaining components I1, I2, and Q1, the bits not used for area A are assigned to the signal points without duplication among the 32 signal points.

The data bit layouts are thus defined for 32 signal points. For components I1, I2, and I3, data bit layouts of 111, 100, 101, 000, and 001 are used for area A. The remaining bit layouts 011 and 110 are not defined yet and hence are assigned to components I1, I2, and I3 in areas B.

In short, the bit layouts need only be assigned by dividing the signal point plane of FIG. 19 into area A and two areas B shown in FIG. 20 according to rules below.

[Area A]

(A-1) In-phase components I1, I2, and I3

For the same amplitude components, the same bit value is assigned to each of the components I1, I2 and I3 independently of quadrature components Q. That is, when the amplitude component level is +5 on the I-axis, the components I1, I2, and I3 are assigned with values of 0, 1, and 0, respectively; when +3, the components I1, I2, and I3 are assigned with the values of 0, 0, and 1, respectively; when +1, the components I1, I2, and I3 are assigned with the values of 0, 0, and 0, respectively; when −1, the components I1, I2, and I3 are assigned with the values of 1, 0, and 1, respectively; when −3, the components I1, I2, and I3 are assigned with the values of 1, 0, and 0, respectively; and when −5, the components I1, I2, and I3 are assigned with the values of 1, 1, and 1, respectively.

(A-2) In-phase component I3

For the component I3, values 0 and 1 are alternately assigned to adjacent signal points along the I-axis. That is, the amplitude component level is +5 on the I-axis, the component I3 is assigned with the value 0. For an adjacent amplitude component level +3, the component I3 is assigned with the value 1. For an adjacent amplitude component level +1, the component I3 is assigned with the value 0. For an adjacent amplitude component level −1, the component I3 is assigned with the value 1. For an adjacent amplitude component level −3, the component I3 is assigned with the value 0. For an adjacent amplitude component level −5, the component I3 is assigned with the value 1.

(A-3) Quadrature components Q1 and Q2

For the same amplitude components levels, the same bit is assigned to each of the components Q1 and Q2 independently of in-phase components (I). That is, when the amplitude component level is +3 on the Q-axis, the components Q1 and Q2 are assigned with values of 0 and 1, respectively; when +1, the components Q1 and Q2 are assigned with the values of 0 and 0, respectively; when −1, the components Q1 and Q2 are assigned with the values of 1 and 1, respectively; and when −3, the components Q1 and Q2 are assigned with the values of 1 and 0, respectively.

(A-4) Quadrature component Q2

For the component Q2, values 0 and 1 are alternately assigned to adjacent signal points along the Q-axis. That is, when the amplitude component level is +3 on the Q-axis, the component Q2 is assigned with the value 1; when +1, namely, at an adjacent amplitude component level, the component Q2 is assigned with the value 0; when −1, namely, at an adjacent amplitude component level, the component Q2 is assigned with the value 1; and when −3, namely, at an adjacent amplitude component level, the component Q2 is assigned with the value 0.

[Areas B]

(B-1) In-phase component I3

For the component I3, 0 and 1 are alternately assigned to adjacent signal points in an alternating phase and in the same alternating sequence or order used in area A. That is, for amplitude component level +3 on the I-axis, the component I3 is the value "1"; for amplitude component level +1 on the I-axis, the component I3 is the value "0"; for amplitude component level −1 on the I-axis, the component I3 is the value "1"; and for amplitude component level −3 on the I-axis, the component I3 is the value "0".

(B-2) Quadrature component Q2

For the component Q2, 0 and 1 are alternately assigned to adjacent signal points along the Q-axis. The alternating phase (sequence or order) is kept unchanged on boundaries between areas A and B.

(B-3) Components I1, I2, and Q1

Bit layouts not used for area A are assigned to the components I1, I2, and Q1 without duplication in areas A and B.

In other words, the rules may be defined as follows.

The signal point plane of the in-phase amplitude component (I)-quadrature amplitude component (Q) coordinate system is divided into a first area and a second area.

In the first area, an identical bit layout of in-phase component is assigned to signal points having an identical in-phase amplitude component, and an identical bit layout of quadrature component is assigned to signal points having an identical quadrature amplitude component.

In the second area, bit layouts other than those used for the first area are assigned to signal points.

In the first and second areas, mutually different bit values, i.e., 0 and 1 are alternately assigned to in-phase component bits corresponding to the in-phase component output from a convolutional encoder for signal points adjacent in the I-axis direction to each other. Mutually different bit values, i.e., 0 and 1 are alternately assigned to quadrature component bits corresponding to the quadrature component output from the convolutional encoder for signal points adjacent in the Q-axis direction to each other. In the case where the direction in which the adjacent signal points extend crosses a boundary between the first and second areas, the order of "0" and "1" is kept unchanged even at the boundary between the first and second areas. In the case where adjacent signal points are parallel in direction to the first area, the order of "0" and "1" is adjusted to be equal to that in the first area. The bit layout is unique to each of 32 signal points.

In response to data of received components I1, I2, I3, Q1, and Q2, the signal point generator 3D shown in FIG. 18 outputs amplitude components of the defined signal points to the roll-off filters 4 and 5. A modulating section 40 and a transmitter section 60 after the filters 4 and 5 are the same as those of FIG. 8, and description thereof will be avoided.

Description will now be given of an embodiment of a decoder having an error correcting operation associated with the embodiment shown in FIG. 18.

In the embodiment in which n is an even number equal to or more than four, the bits are assigned to signal points on the constellation plane in a completely independent way with respect to the I-axis and Q-axis. However, in the embodiment of FIG. 18, the bit assignment is not completely independently achieved for the I-axis and Q-axis as shown in FIG. 20.

Figure 21:
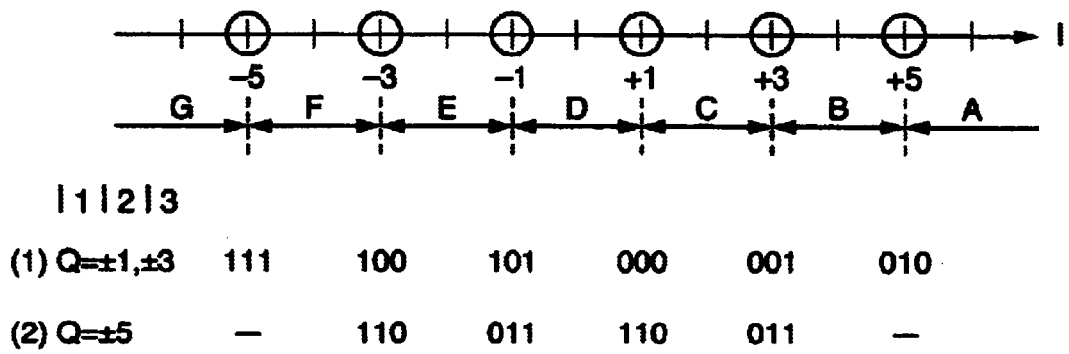
FIG. 21 is a diagram to explain a decoding method of I-axis components in the embodiment of a 32 QAM system shown in FIG. 18.

As can be seen from FIG. 21, since the I-axis is not independent of the Q-axis in the bit assignment, the bit assignment to components I1, I2, and I3 is duplicated at some signal points.

For example, for an I-axis amplitude component levels +3, +1, −1 and −3, the components I1, I2, and I3 are assigned with values in two cases, namely, a first case of (0, 0, 1), (0, 0, 0), (1, 0, 1), and (1, 0, 0) or a second case of (0, 1, 1), (1, 1, 0), (0, 1, 1), and (1, 1, 0).

However, the duplicated states can be discriminated from each other according to the Q-axis amplitude component. That is, when the Q-axis amplitude component level is ±1 or ±3, the components I1, I2, and I3 are (0, 0, 1), (0, 0, 0), (1, 0, 1), and (1, 0, 0). When the Q-axis amplitude component level is ±5, the components I1, I2, and I3 are (0, 1, 1), (1, 1, 0), (0, 1, 1), and (1, 1, 0). Therefore, the I-axis components can be decoded by collating these values with information of the amplitude components along the Q-axis.

Figure 22:
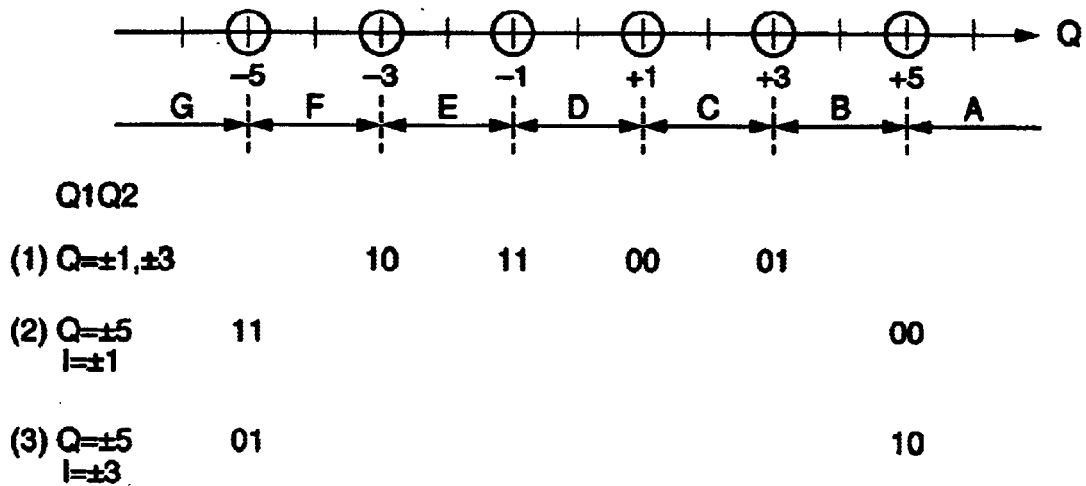
FIG. 22 is a diagram to explain a decoding method of Q-axis components in the embodiment of a 32 QAM system shown in FIG. 18.

As shown in FIG. 22, since the Q-axis amplitude components are not independent of the I-axis amplitude components, duplication occurs in the bit assignment to the Q-axis components Q1 and Q2.

Fog example, when the Q-axis amplitude component level is ±5, Q1 and Q2 are assigned in two cases, i.e., a first case of (0, 0), and (1, 1) and a second case of (1, 0) and (0, 1).

Also in this situation, when the I-axis amplitude component level is ±1, the components Q1 and Q2 are (0, 0) and (1, 1). When the I-axis amplitude component level is ±3, the components Q1 and Q2 are (1, 0) and (0, 1). Therefore, the Q-axis components can be decoded by collating these values with information of the amplitude components along the I-axis. In the case of the previous embodiment with n being an even number-equal to 4 or greater, received amplitude component can be independently decoded for I- and Q-axis by the soft decision decoder 27 shown in FIG. 12. However, in the embodiment of $2^n$ QAM system (n is an odd number equal to a more than five), the amplitude components of the received signal point can be identified for the I- and Q-axes as above. Although, to decode the identified components into bits, the method of the embodiment with n being an even number equal 4 or greater cannot be directly employed.

Figure 23:
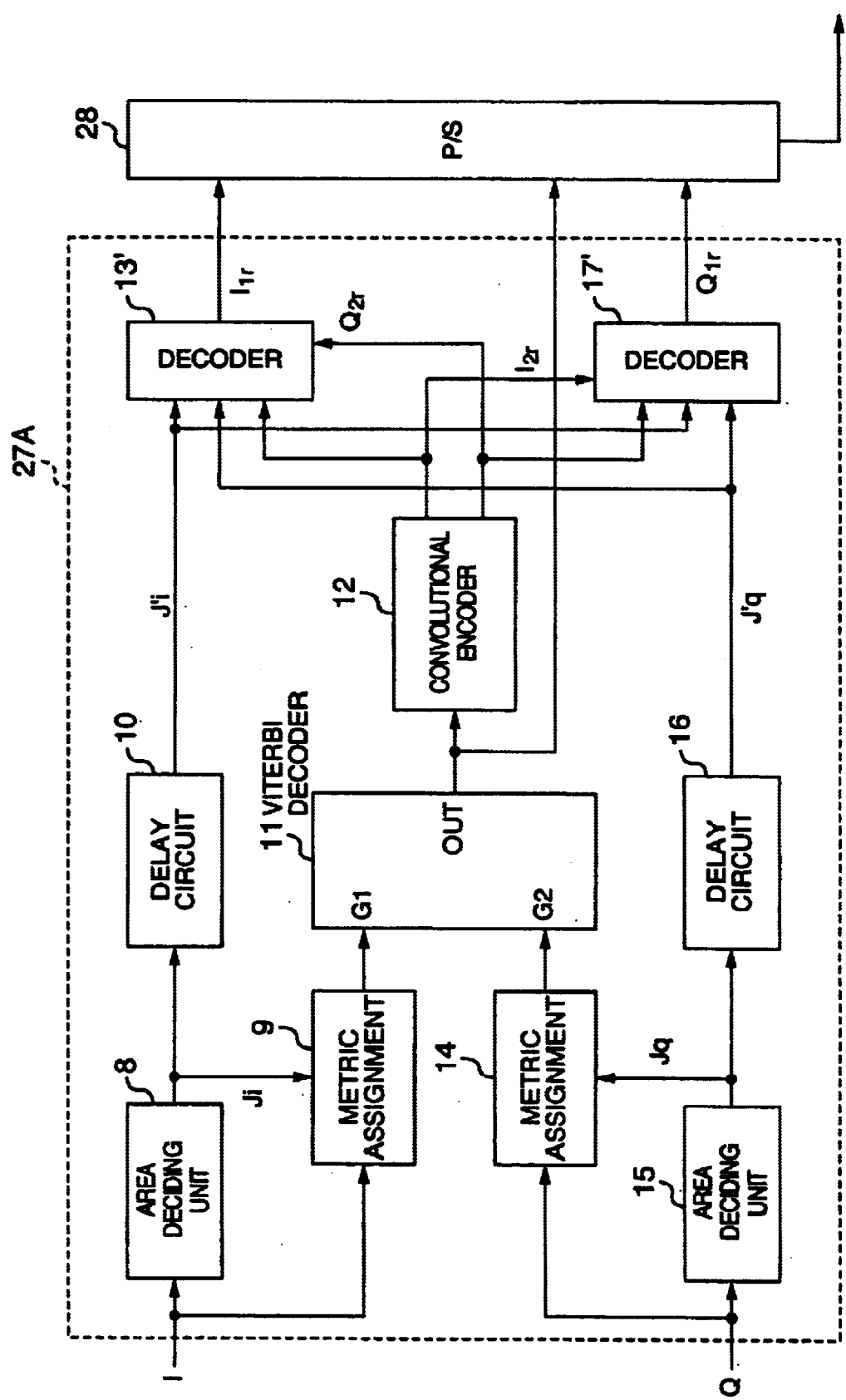
FIG. 23 is a block diagram showing a configuration of a decision decoder section in the embodiment shown in FIG. 18.

In the present embodiment, in place of decoders 13 and 17 to decode bits, a soft decision decoding unit 27A which receives information of axes of the other party to conduct the decoding operation is employed as shown in FIG. 23.

Therefore, in the soft decision decoding unit 27A, in addition to a signal Ji' sent via a delay circuit 10 from an area deciding section 8 and an output I2r from a convolutional decoder 12, a signal Jq' sent via a delay circuit 16 from an area deciding section 15 and an output Q2r from the convolutional encoder 12 are supplied to an I-axis decoder 13'. As a result, the Q-axis amplitude component of the received signal point can be identifier so that the I-axis bit decoding is achieved.

This also applied to the Q-axis. The signal Ji' sent via the delay circuit 10 from the area deciding section 8 and the output I2r from the convolutional decoder 12 are also supplied to a Q-axis decoder 17'
in addition to the signal Jq' and the output Q2r. Therefore, the I-axis amplitude component of the received signal point can be identifier so that the Q-axis bit decoding is carried out.

By inputting output signals I1r and Q1r respectively from the decoders 13' and 17' and a signal outputted from a Viterbi decoder 11 to a parallel/serial converter 28, there can be produced correct reception data without any error in the form of a serial signal in the 32 QAM system.

The embodiment associated with the 32 QAM system has a coding rate of ⅘ and hence brings about high data transmission efficiency.

Like the preceding embodiments, the present embodiment requires only one convolutional decoder on the transmission apparatus side without counting on the reception apparatus side and only one Viterbi decoder on the reception apparatus side to process both I-axis and Q-axis components. This reduces the circuit size. The convolutional decoder and the Viterbi decoder are available on the market. In consequence, the constituent components are easily available on the market and accordingly the system cost is lowered.

In the case where the present invention is applied to a 128 QAM system, namely, to a transmission system in which n is seven in the $2^n$ QAM system, the I-axis and Q-axis components can be similarly processed using one convolutional decoder on transmission apparatus side, without counting on the reception apparatus side and one Viterbi decoder on reception apparatus side only by defining the bit layouts on the constellation plane of the signal point generator in the same way as for that used for the 32 QAM system.

Figure 24:
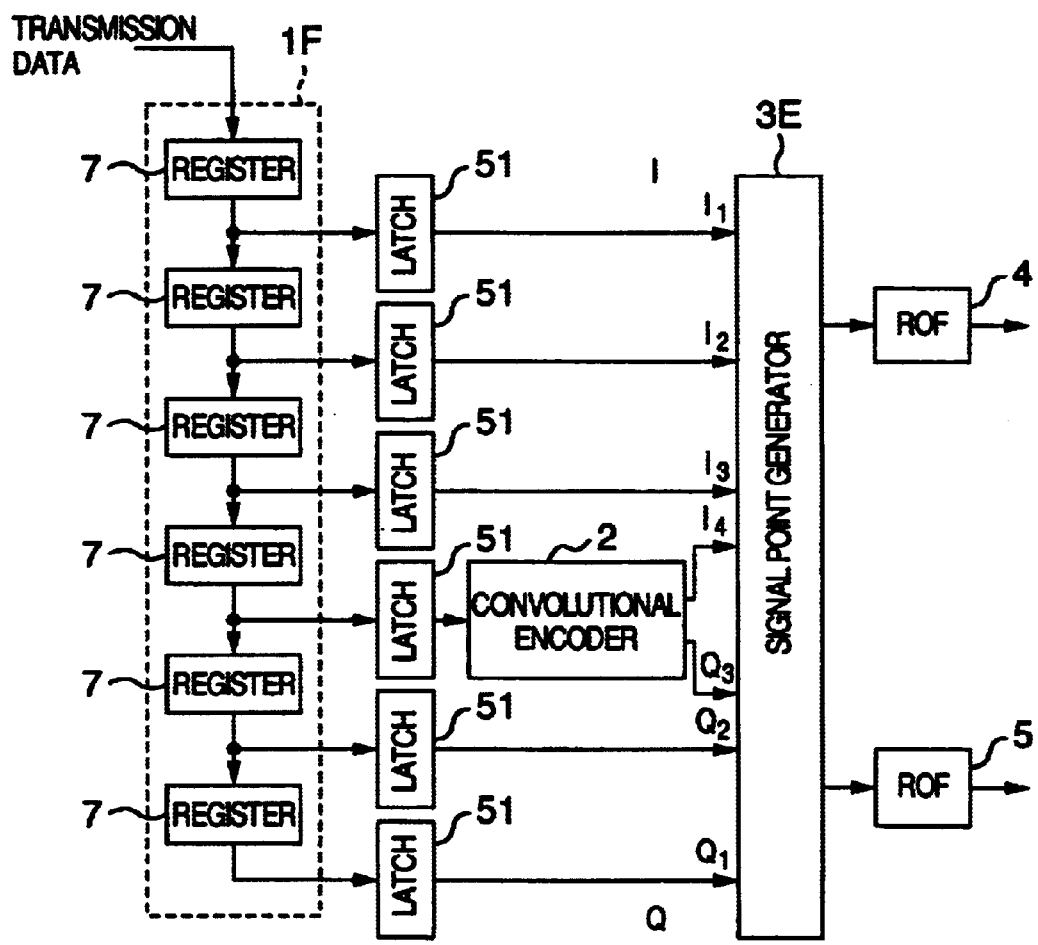
FIG. 24 is a block diagram showing an embodiment of an encoder having an error correcting function in a transmission system using a 128 QAM system in accordance with the present invention.
Figure 25:
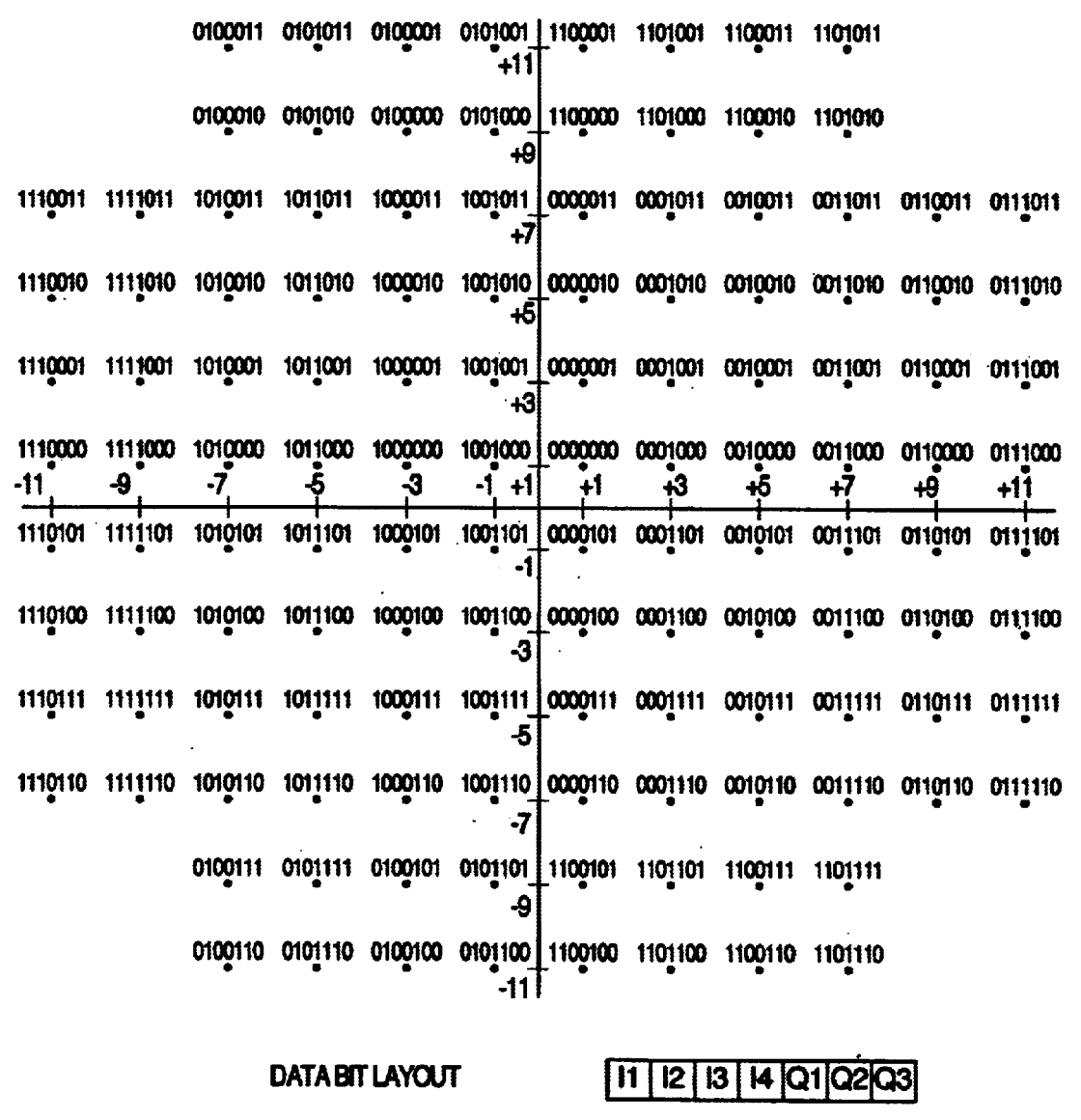
Figure 26:
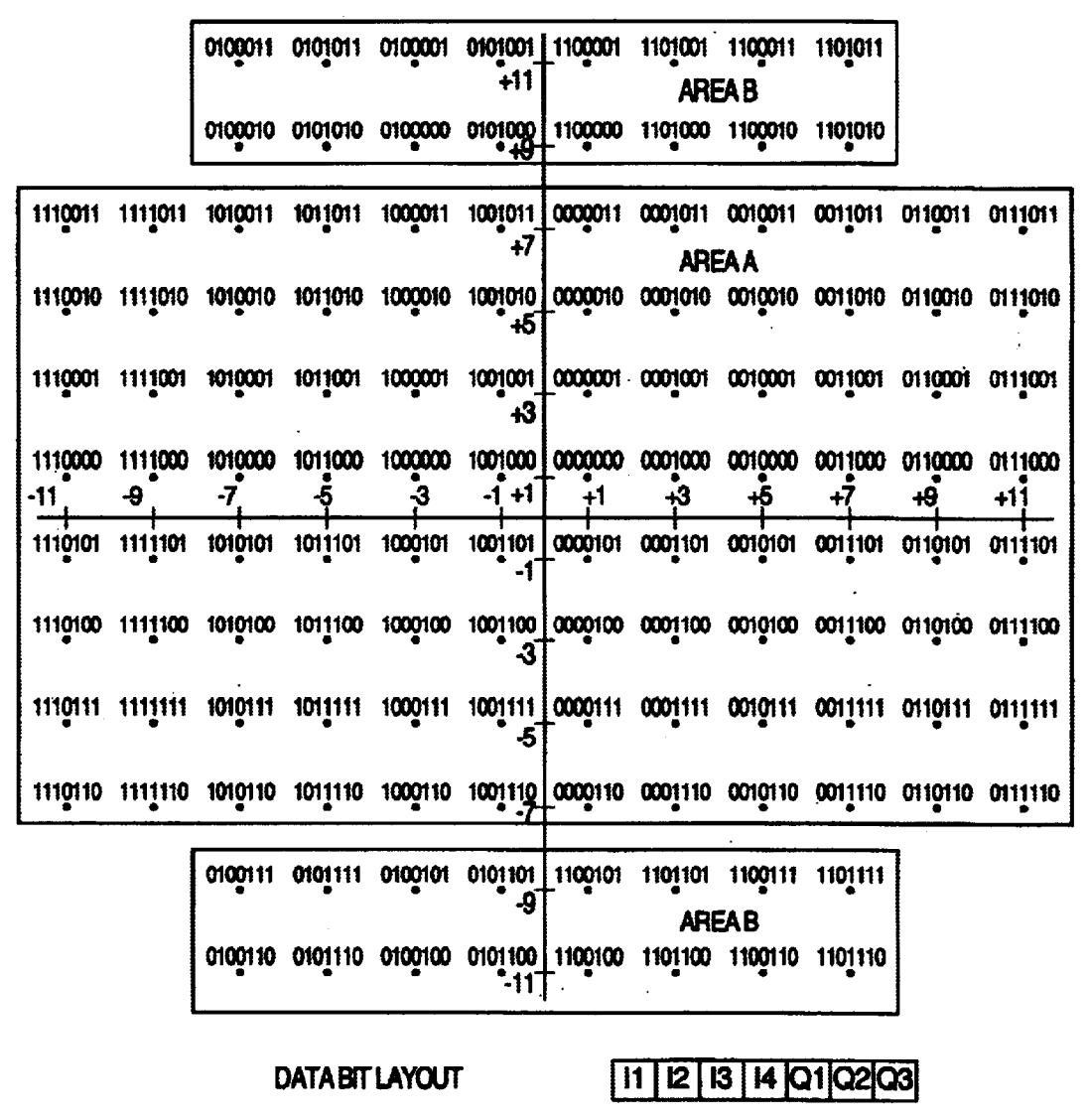

FIG. 24 shows an embodiment of a decoder having an error correcting operation of a 128 QAM system in accordance with the present invention. Specifically, in a $2^n$ QAM system, the value n is seven. FIGS. 25 and 26 show examples of bit layouts in the 128 QAM system.

In FIG. 24, transmission data is inputted to a serial/parallel converter 1F including six registers 7 and is converted into a 6-bit parallel signal. Output data of each register is stored in an associated latch 51. In the embodiment, a third bit relative to a first bit of the data from the serial/parallel converter 1F is fed to a convolutional encoder 2 to produce components I4 and Q3. Data not fed to the encoder 2 are directly used as components I1, I2, I3, Q2, and Q1. Any one bits of the data may be inputted to the encoder 2.

These components are combined and the components I1, I2, I3, and I4 and the components Q1, Q2, and Q3 are supplied to a signal point generator 3E.

In the generator 3E, bit layouts are defined for signal points as shown in FIG. 25. To decide the bit layouts, $2^n$ bit layouts (n=7 and hence 128 bit layouts in the embodiment) are used. Like in FIG. 20, the signal points of FIG. 25 are divided into one area A and two areas B as shown in FIG. 26.

Note here that in the area A components I1, I2, I3 and I4 represent in-phase component and components Q1, Q2 and Q3 represent quadrature components. Therefore the components I1, I2, I3 and I4 will be referred to as in-phase components and components Q1, Q2 and Q3 will be referred to as quadrature components in the following both areas.

The rule of the bit layouts is similar to the rule described in conjunction with FIG. 18. That is, in areas B, at least 0 and 1 are assigned to components I4 and Q3 in the same way as for FIG. 18. Other bit assignment is made in the same way as for area A, whenever possible. In the case where bits cannot be assigned in this manner, it is only necessary to assign remaining bits. In the 128 QAM system of the present embodiment, a rule to assign identical bits to in-phase components at signal points having an identical in-phase amplitude component level can be used. However, a rule to assign identical bits to quadrature components at signal points having an identical quadrature amplitude component level is not applicable to the present embodiment. In short, in areas B including boundaries between area A and areas B, values 0 and 1 are alternately assigned. Same bits are assigned to in-phase components at signal points having an identical in-phase amplitude component level. For components Q1 and Q2, bits not yet used are assigned. In this way, bits need only be assigned to areas B.

The embodiment of the 128 QAM system has a coding rate of 6/7 and hence data transmission efficiency is improved. Like the preceding embodiments, the system cost can be minimized.

The present invention is also applicable to a case in which n is an integer equal to or more than four in the multilevel QAM system. In the case where n is an odd number equal to or more than five, the coding rate is, for example, ⅘ in the 32 QAM system (n=5) and 6/7 in the 128 QAM system (n=7), and hence a high coding rate can be easily attained. Resultantly, in accordance with the embodiments, the bit rate is increased and transmission efficiency is remarkably improved. In the case where n is an even number equal to or more than four, the coding rate is, for example, ¾ in the 16 QAM system (n=4), ⅚ in the 64 QAM system (n=6), and ⅞ in the 256 QAM system (n=8), and hence a high coding rate can be also easily attained.

In the embodiments, only one convolutional decoder 2 is required on the transmission apparatus side, without counting on the reception apparatus side and only one Viterbi decoder is required on the reception apparatus side to process both I-axis and Q-axis components. This reduces the circuit size and the system cost.

In accordance with the present invention, the convolutional decoder and the Viterbi decoder as constituent components are available on the market. The encoder and decoder are easily available on the market and accordingly the system cost is lowered.

While the invention has been particularly described and shown with reference to the embodiments thereof, it will be understood by those ordinary skilled in the art that various changes in form and detail and omissions may be made therein without departing from the scope thereof. For example, the present invention is not restricted by the convolutional encoders above. There may be used a particular convolutional encoder, for example, one having a long constraint length to further improve the error correcting capability. Namely, any type of convolutional encoder and any type of Viterbi decoder can be employed. In this sense, the prevent invention is quite flexible.

What is claimed is:

1. An encoder with error correction for use in a transmitting apparatus which sends data in a $2^n$ QAM system (n is an integer equal to or more than four), comprising:
    a converting section for converting said data into (n−1)-bit parallel data;
    a convolutional encoder for receiving one bit of the (n−1)-bit parallel data; and
    a signal point generator for receiving 2-bit data outputted from said convolutional encoder and data including remaining bits of the (n−1)-bit parallel data,
    wherein the 2-bit data from said convolutional encoder and the data of the remaining bits of the (n−1)bit—parallel data are separated, respectively, into an in-phase component and a quadrature component, each of which is inputted to said signal point generator;
    said signal point generator generates multilevel signals according to the $2^n$ QAM system which includes said multilevel signals constituted as below, so as to be able to simply decode in a decoder:
        in a signal point plane of an in-phase amplitude component (I)—quadrature amplitude component (Q) coordinate system, an identical bit layout is assigned to in-phase components at signal points having an identical in-phase amplitude component and an identical bit layout is assigned to quadrature components at signal points having an identical quadrature amplitude component;
        for in-phase components at signal points adjacent to each other in a direction of an in-phase amplitude component axis mutually different bit value is assigned to the lowest bit of an in-phase component output from said convolutional encoder, regardless of each quadrant of I-Q coordinate system;
        so that said signal points are independently assigned to each other in said in-phase components and said quadrature components in the direction of said in-phase and quadrature amplitude components axis, respectively, and each of said signal points according to said signals output from said convolutional encoder is assigned in an identical bit layout in each quadrant of I-Q coordinate system.

2. An encoder with error correction for use in a transmitting apparatus which sends data in a $2^n$ QAM system (n is an integer equal to or more than four), comprising:
    a converting section for converting said data into (n−1)-bit parallel data;
    a convolutional encoder for receiving one bit of the (n−1)-bit parallel data; and
    a signal point generator for receiving 2-bit data outputted from said convolutional encoder and data including remaining bits of the (n−1-bit parallel data,
    wherein the 2-bit data from said convolutional encoder and the data of the remaining bits of the (n−1)bit parallel data are separated, respectively, into an in-phase component and a quadrature component, each of which is inputted to said signal point generator; and
    said signal point generator generates multilevel signals according to the $2^n$ QAM system which includes said multilevel signals constituted as below, so as to be able to simply decode in a decoder:
        in a signal point plane of an in-phase amplitude component (I)—quadrature amplitude component (Q) coordinate system, said plane is divided into a first area and second areas;
        in said first area, an identical bit layout is assigned to in-phase components at signal points having an identical in-phase amplitude component and an identical bit layout is assigned to quadrature components at signal points having an identical quadrature amplitude component;
        in the first and second areas, mutually different bit values are assigned to the lowest bit of an in-phase component output from said convolutional encoder for signal points adjacent to each other in a direction of an in-phase amplitude component axis, regardless of each quadrant of I-Q coordinate system, and mutually different bit values are assigned to the lowest bit of a quadrature component output from said convolutional encoder at signal points adjacent to each other in a direction of a quadrature amplitude component axis, regardless of each quadrant of I-Q coordinate system, and
        bit arrays not assigned to the first area are assigned to signal points in the second areas;
        so that said signal points are independently assigned to each other in said in-phase components and said quadrature components in the direction of said in-phase and quadrature amplitude components axis, respectively, and each of said signal points according to said signals output from said convolutional encoder is assigned in an identical bit layout in each quadrant of I-Q coordinate system, in the first and second areas.

3. An encoder with error correction according to claim 2, wherein in the second area, bit layouts not assigned to the first area are assigned such that:
    an identical bit layout, as available as possible from said bit layouts not assigned, is assigned to in-phase components at signal points having an identical in-phase amplitude component and/or;
    an identical bit layout, as available as possible from said bit layouts not assigned, is assigned to quadrature components at signal points having an identical quadrature amplitude component.

4. An encoder with error correction for use in a transmitting apparatus which sends data in a $2^n$ QAM system (n is an integer equal to or more than four), comprising:
    a converting section for converting said data into (n−1)-bit parallel data;
    a convolutional encoder for receiving one bit of the (n−1)-bit parallel data; and
    a signal point generator for receiving 2-bit data outputted from said convolutional encoder and data including remaining bits of the (n−1)-bit parallel data, wherein:
        the 2-bit data from said convolutional encoder and the data of the remaining bits of the (n−1)bit—parallel data are separated, respectively, into an in-phase component and a quadrature component, each of which is inputted to said signal point generator;

said signal point generator generates multilevel signals according to the $2^n$ QAM system which includes said multilevel signals constituted as below, so as to be able to simply decode in a decoder:

in a signal point plane of an in-phase amplitude (I) component - quadrature amplitude component (Q) coordinate system, said plane is divided into a first area and a plurality of second areas;

in the first area, an identical bit layout is assigned to in-phase components at signal points having an identical in-phase amplitude component and an identical bit layout is assigned to quadrature components at signal points having an identical quadrature amplitude component;

in the second areas, bit layouts not assigned to the first area are assigned such that an identical bit layout, as available as possible from said bit layouts not assigned, is assigned to in-phase components at signal points having an identical in-phase amplitude component;

in the first and second areas, mutually different bit values are assigned to the lowest bit of an in-phase component output from said convolutional encoder at signal points adjacent to each other in a direction of an in-phase component axis, regardless of each quadrant of I-Q coordinate system, and mutually different bit values are assigned to the lowest bit of a quadrature component output from said convolutional encoder at signal points adjacent to each other in a direction of a quadrature amplitude component axis, regardless of each quadrant of I-Q coordinate system; and for quadrature components at signal points in the second areas, bits of bit arrays not assigned yet are assigned to bits other than bits corresponding to the in-phase component output from said convolutional encoder;

so that said signal points are independently assigned to each other in said in-phase components and said quadrature components in the direction of said in-phase and quadrature amplitude components axis, respectively, and each of said signal points according to said signals output from said convolutional encoder is assigned in an identical bit layout in each quadrant of I-Q coordinate system, in the first and second areas.

5. An encoder with error correction for use with $2^n$ QAM signals (n is an integer equal to or more than four), an in-phase component signal and a quadrature component signal of said $2^n$ QAM signals having mutually different bit values in a signal point plane of an in-phase amplitude component (I)—quadrature amplitude component (Q) coordinate system, regardless of each quadrant of said I-Q coordinate system, comprising:

an area deciding section for receiving an in-phase component (I) signal and an quadrature component (Q) signal of the QAM signals, wherein said area deciding section decides, to which quadrant of a signal point plane of an in-phase amplitude component (I)—quadrature amplitude component (Q) coordinate system, said in-phase component (I) signal and said quadrant component (Q) signal belongs;

first and second metric assigning sections for producing, based on the result of said area deciding section, metric for the in-phase component (I) and quadrature component (Q) signals, respectively;

a Viterbi decoder for receiving the metrics for the in-phase component (I) and quadrature component (Q) signals;

a convolutional encoder for receiving a data signal outputted from said Viterbi decoder;

first and second decoders for being applied each of the in-phase component (I) and quadrature component (Q) signals from said area deciding section and said convolutional encoder, and a parallel/serial converter for receiving an output from said Viterbi decoder and outputs from said first and second decoders.

6. An decoder with error correction according to claim 5, wherein n is an even number equal to or more than four;

said first decoder receives a data signal for said in-phase component signal from said convolutional encoder and the result from said area deciding section;

said second decoder receives a data signal for said quadrature component signal from said convolutional encoder and the result from said area deciding section; and an output from said first decoder for the in-phase component signal, an output from said second decoder for the quadrature component signal, and the output from said Viterbi decoder are inputted to said parallel/serial converter.

7. A decoder with error correction according to claim 5, wherein n is an odd number equal to or more than five;

said first decoder receives a data signal for said quadrature component signal from said convolutional encoder and the results for said in-phase component signal and for said quadrature component signal from said area deciding section;

said second decoder receives a data signal for the quadrature component signal and a data signal for said in-phase component signal from said convolutional encoder, and the results of area decision for a quadrature component signal and for said in-phase component signal from said area deciding section, and an output from said first decoder for an in-phase component signal, an output from said second decoder for a quadrature component signal, and the output from said Viterbi decoder are inputted to said parallel/serial converter.

8. A data transmission apparatus for sending transmission data in a $2^n$ QAM system (n is an even number equal to or more than four), comprising:

a transmitter section; and a receiver section, said transmitter section comprising:

an encoder with error correction for receiving said data as an input signal, for converting said data into an in-phase component signal and a quadrature component signal in a parallel signal form, the in-phase component signal and the quadrature component signal being orthogonal to each other, and for outputting the signals therefrom; and a modulator section for receiving the in-phase and quadrature component signals from said encoder with error correction, for generating an analog modulated wave signal using the in-phase and quadrature component signals, and for outputting the analog modulated wave signal therefrom;

said receiver section comprising:

a demodulator section for receiving the analog modulated wave signal from said transmitter section and for demodulating the analog modulated wave signal to generate an in-phase component signal and a quadrature component signal; and a decoder with error correction for receiving the in-phase component signal and the quadrature component signal from said demodulator section and for decoding the in-phase and quadrature component signals, wherein said encoder with error correction comprising:

a converter section for converting said data into (n−1)-bit parallel data;

a convolutional encoder for receiving one bit of the (n−1)-bit parallel data; and a signal point generator for receiving 2-bit data outputted from said convolutional encoder and data including remaining bits of the (n−1)-bit parallel data, wherein each of the 2-bit data from said convolutional encoder and said data including remaining bits of the (n−1)-bit parallel data is separated into an in-phase component and a quadrature component to be fed to said signal point generator, and wherein said signal point generator thereby generates a multilevel signal according to the $2^n$ QAM system which includes multilevel signals formed as below:

in a signal point plane of an in-phase amplitude component (I)—quadrature amplitude component (Q) coordinate system, an identical bit layout is assigned to in-phase components at signal points having an identical in-phase amplitude component and an identical bit layout is assigned to quadrature components at signal points having an identical quadrature amplitude component;

for in-phase components at signal points adjacent to each other in a direction of an in-phase amplitude component axis, mutually different bit value is assigned to the lowest bit of an in-phase component output from said convolutional encoder, regardless of each quadrant if I-Q coordinate system, so that said signal points are independently assigned to each other in said in-phase components and said quadrature components in the direction of said in-phase and quadrature amplitude components axis, respectively, and each of said signal points according to said signals output from said convolutional encoder is assigned in an identical bit layout in each quadrant of I-Q coordinate system.

9. A data transmission apparatus for sending transmission data in a $2^n$ QAM system (n is an odd number equal to or more than five), comprising:

a transmitter section; and a receiver section, said transmitter section comprising:

an encoder with error correction for receiving said data as an input signal, for converting said data into an in-phase component signal and a quadrature component signal in a parallel signal form, the in-phase component signal and the quadrature component signal being orthogonal to each other, and for outputting the signals therefrom; and a modulator section for receiving the in-phase and quadrature component signals from said encoder with error correction, for generating an analog modulated wave signal using the in-phase and quadrature component signals, and for outputting the analog modulated wave signal therefrom;

said receiver section comprising:

a demodulator section for receiving the analog modulated wave signal from said transmitter section and for demodulating the analog modulated wave signal to generate an in-phase component signal and a quadrature component signal; and a decoder with error correction for receiving the in-phase component signal and the quadrature component signal from said demodulator section and for decoding the in-phase and quadrature component signals, wherein said encoder with error correction comprising:

a converting section for converting said data into (n−1)-bit parallel data;

a convolutional encoder for receiving one bit of the (n−1)-bit parallel data; and a signal point generator for receiving 2-bit data outputted from said convolutional encoder and data including remaining bits of the (n−1)-bit parallel data, wherein each of the 2-bit data from said convolutional encoder and said data including remaining bits of the (n−1)-bit parallel data is separated into an in-phase component and a quadrature component to be fed to said signal point generator, and wherein said signal point generator thereby generates a multilevel signal according to the $2^n$ QAM system which includes multilevel signals formed as below:

in a signal point plane of an in-phase amplitude component (I)—quadrature amplitude component (Q) coordinate system, said plane is divided into a first area and a plurality of second areas;

in the first area, an identical bit layout is assigned to in-phase components at signal points having an identical in-phase amplitude component and an identical bit layout is assigned to quadrature components at signal points having an identical quadrature amplitude component;

in the first and second areas, mutually different bit values are assigned to the lowest bit of an in-phase component output from said convolutional encoder for signal points adjacent to each other in a direction of an in-phase amplitude component axis, regardless of each quadrant of I-Q coordinate system, and mutually different bit values are assigned to bits corresponding to a quadrature component output from said convolutional encoder at signal points adjacent to each other in a direction of a quadrature amplitude component axis, regardless of each quadrant of I-Q coordinate system; and bit arrays not assigned to the first area are assigned to signal points in the second areas; and mutually different bit layouts are assigned to respective signal points in the first and second areas.

10. A data transmission apparatus according to claim 9, wherein:

in the second areas, bit layouts not assigned to the first area are assigned such that:

an identical bit layout, as available as possible from said bit layouts not assigned, is assigned to in-phase components at signal points having an identical in-phase amplitude component; and an identical bit layout, as available as possible from said bit layouts not assigned, is assigned to quadrature components at signal points having an identical quadrature amplitude component.

11. A data transmission apparatus for sending transmission data in a $2^n$ QAM system (n is seven), comprising:

a transmitter section; and a receiver section,
said transmitter section comprising:
an encoder with error correction for receiving said data as an input signal, for converting said data into an in-phase component signal and a quadrature component signal in a parallel signal form, the in-phase component signal and the quadrature component signal being orthogonal to each other, and for outputting the signals therefrom; and
a modulator section for receiving the in-phase and quadrature component signals from said encoder with error correction, for generating an analog modulated wave signal using the in-phase and quadrature component signals, and for outputting the analog modulated wave signal therefrom;
said receiver section comprising:
a demodulator section for receiving the analog modulated wave signal from said transmitter section and for demodulating the analog modulated wave signal to generate an in-phase component signal and a quadrature component signal; and
a decoder with error correction for receiving the in-phase component signal and the quadrature component signal from said demodulator section and for decoding the in-phase and quadrature component signals,
wherein said encoder with error correction comprising:
a converting section for converting said data into (n−1)-bit parallel data;
a convolutional encoder for receiving one bit of the (n−1)-bit parallel data; and
a signal point generator for receiving 2-bit data outputted from said convolutional encoder and data including remaining bits of the (n−1)-bit parallel data,
wherein each of the 2-bit data from said convolutional encoder and said data including remaining bits of the (n−1)-bit parallel data is separated into an in-phase component and a quadrature component to be fed to said signal point generator, and
wherein said signal point generator thereby generates a multilevel signal according to the $2^n$ QAM system which includes multilevel signals formed as below:
in a signal point plane of an in-phase amplitude component(1)—quadrature amplitude component (Q) coordinate system, said plane is divided into a first area and a plurality of second areas;
in the first area, an identical bit layout is assigned to in-phase components at signal points having an identical in-phase amplitude component and an identical bit layout is assigned to quadrature components at signal points having an identical quadrature amplitude component;
in the second areas, bit layouts not assigned to the first area are assigned such that an identical bit layout to in-phase components at signal points having an identical in-phase amplitude component;
in the first and second areas, mutually different bit values are assigned to the lowest bit of an in-phase component output from said convolutional encoder at signal points adjacent to each other in a direction of an in-phase component axis, regardless of each quadrant of I-Q coordinate system; and mutually different bit values are assigned to the lowest bit of a quadrature component output from said convolutional encoder at signal points adjacent to each other in a direction of a quadrature amplitude component axis, regardless of each quadrant of I-Q coordinate system; and
for quadrature components at signal points in the second areas, bits of bit layouts not assigned yet are assigned to bits other than bits equivalent to in-phase component outputs from said convolutional encoder;
so that said signal points are independently assigned to each other in said in-phase components and said quadrature components in the direction of said in-phase and quadrature amplitude components axis, respectively, and each of said signal points according to said signals output from said convolutional encoder is assigned in an identical bit layout in each quadrant of I-Q coordinate system in the first and second areas.

12. A data transmission apparatus for sending transmission data in a $2^n$ QAM system (n is an even number equal to or more than four), comprising:
a transmitter section; and
a receiver section,
said transmitter section comprising:
an decoder with error correction for receiving said data as an input signal, for converting said data into an in-phase component signal and a quadrature component signal in a parallel signal form, the in-phase component signal and the quadrature component signal being orthogonal to each other, and for outputting the signals therefrom; and
a modulator section for receiving the in-phase and quadrature component signals from said encoder with error correction, for generating an analog modulated wave signal using the in-phase and quadrature component signals, and for outputting the analog modulated wave signal therefrom;
said receiver section comprising:
a demodulator section for receiving the analog modulated wave signal from said transmitter section and for demodulating the analog modulated wave signal to generate an in-phase component signal and a quadrature component signal; and
a decoder with error correction for receiving the in-phase component signal and the quadrature component signal from said demodulator section and for decoding the in-phase and quadrature component signals,
wherein said encoder with error correction for use with $2^n$ QAM signals, an in-phase component signal and a quadrature component signal of said $2^n$ QAM signals having mutually different bit values in a signal point plane of an in-phase amplitude component (I)—quadrature amplitude component (Q) coordinate system, regardless of each quadrant of said I-Q coordinate system, comprising:
an area deciding section for receiving the in-phase component(1)-signal and the quadrature component (Q) signal of the QAM signals, wherein said area deciding section decides, to which quadrant of a signal point plane of an in-phase amplitude component (I)—quadrature amplitude component (Q) coordinate system, said in-phase component (I) signal and said quadrature component (Q) signal belongs;
first and second metric assigning sections for producing, based on the result of said area deciding section, metric for the in-phase component (I) and quadrature component (Q) signals, respectively;
a Viterbi decoder for receiving the metrics for the in-phase component (I) and quadrature component (Q) signals;

a convolutional encoder for receiving a data signal outputted from said Viterbi decoder;

first and second decoders for being applied each of the in-phase component (I) and quadrature component (Q) signals from said area deciding section and said convolutional encoder, and a parallel/serial converter for receiving an output from said Viterbi decoder and outputs from said first and second decoders.

13. A data transmission apparatus according to claim 12, wherein n is an even number equal to or more than four;

said first decoder receives a data signal for said in-phase component signal from said convolutional encoder and the result from said area deciding section; and said second decoder receives a data signal for said quadrature component signal from said convolutional encoder and the result from said area deciding section, an output from said first decoder for the in-phase component signal, and output from said second decoder for the quadrature component signal, and the output from said Viterbi decoder are inputted to said parallel/serial converter.

14. A data transmission apparatus according to claim 12, wherein n is an odd number equal to or more than five;

said first decoder receives a data signal for said in-phase component signal from said convolutional encoder and the results for said in-phase component signal and for said quadrature component signal from said area deciding section;

said second decoder receives a data signal for the quadrature component signal and a data signal said in-phase component signal from said convolutional encoder, and the results of area decision for a quadrature component signal and for in-phase component signal from said area deciding section; and an output from said first decoder for an in-phase component, an output from said second decoder for a quadrature component signal, and the output from said Viterbi decoder are inputted to said parallel/serial converter.

15. A data transmission apparatus for sending data in a $2^n$ QAM system (n is an integer equal to or more than four), comprising:

a converting section for converting said data into (n−1)-bit parallel data;

a convolutional encoder for receiving one bit of the (n−1)-bit parallel data;

a signal point generator for receiving 2-bit data outputted from said convolutional encoder and data including remaining bits of the (n 31 1)-bit parallel data, the 2-bit data from said convolutional encoder and the data of the remaining bits of the (n−1)-bit parallel data being separated, respectively, into an in-phase component signal and a quadrature component signal, in response to receiving the in-phase and quadrature component signals, said signal point generator generating multi-level signals according to the $2^n$ QAM system;

a modulator for receiving outputs from said signal point generator, said modulator modulating the in-phase and quadrature component signals respectively with modulating signals which are respectively orthogonal to the in-phase and quadrature component signals and each of which has a predetermined frequency, said modulating signals being added to each other; and a transmitting section for receiving an output from said modulator and for outputting a transmission signal, wherein the $2^n$ QAM system (n is an even number equal to or more than four) includes multilevel signals formed as below:

in a signal point plane of an in-phase amplitude component (I)—quadrature amplitude component (Q) coordinate system, an identical bit layout is assigned to in-phase components at signal points having an identical in-phase amplitude component and an identical bit layout is assigned to quadrature components at signal points having an identical quadrature amplitude component;

for in-phase components at signal points adjacent to each other in a direction of an in-phase amplitude component axis, mutually different bit value is assigned to the lowest bit—of an in-phase component outputs form said convolutional encoder, regardless of each quadrant of I-Q coordinate system;

for quadrature components at signal points adjacent to each other in a direction of a quadrature amplitude component axis, mutually different bit value is assigned to the lowest bit of a quadrature component outputs from said convolutional encoder, so that said signal points are independently assigned to each other in said in-phase components and said quadrature components in the direction of said in-phase and quadrature amplitude components axis, respectively, and each of said signal points according to said signals output from said convolutional encoder is assigned in an identical bit layout in each quadrant of I-Q coordinate system in the first and second areas.

16. A data transmission apparatus for sending data in a $2^n$ QAM system (n is an integer equal to or more than four), comprising:

a converting section for converting said data into (n−1)-bit parallel data;

a convolutional encoder for receiving one bit of the (n−1)-bit parallel data;

a signal point generator for receiving 2-bit data outputted from said convolutional encoder and data including remaining bits of the (n−1)-bit parallel data, the 2-bit data from said convolutional encoder and the data of the remaining bits of the (n−1)-bit parallel data being separated, respectively, into an in-phase component signal and a quadrature component signal, in response to receiving the in-phase and quadrature component signals, said signal point generator generating multi-level signals according to the $2^n$ QAM system;

a modulator for receiving outputs from said signal point generator, said modulator modulating the in-phase and quadrature component signals respectively with modulating signals which are respectively orthogonal to the in-phase and quadrature component signals and each of which has a predetermined frequency, said modulating signals being added to each other; and a transmitting section for receiving an output from said modulator and for outputting a transmission signal, wherein the $2^n$ QAM system (n is an odd number equal to or more than five) includes multilevel signals as formed below:

a signal point plane of an in-phase component (I)—quadrature amplitude component (Q) coordinate system is divided into a first area and a plurality of second areas;

in the first area, an identical bit layout is assigned to in-phase components at signal points having an identical in-phase amplitude component and an identical bit layout is assigned to quadrature components at signal points having an identical quadrature amplitude component;

in the first and second areas, mutually different bit values are assigned to the lowest bit of an in-phase component output from said convolutional encoder for signal points adjacent to each other in a direction of an in-phase amplitude component axis, regardless of each quadrant of I-Q coordinate system and mutually different bit values are assigned to the lowest bit of a quadrature component output from said convolutional encoder at signal points adjacent to each other in a direction of a quadrature amplitude component axis, regardless of each quadrant of I-Q coordinate system, bit arrays not assigned to the first area are assigned to signal points in the second areas; and mutually different bit layouts are assigned to respective signal points in the first and second areas, so that said signal points are independently assigned to each other in said in-phase components and said quadrature components in the direction of said in-phase and quadrature amplitude components axis, respectively, and each of said signal points according to said signals output from said convolutional encoder is assigned in an identical bit layout in each quadrant of I-Q coordinate system in the first and second areas.

17. A data reception apparatus for receiving a multilevel signal in a $2^n$ QAM system (n is an integer equal to or more than four), comprising:

a demodulator for demodulating the multilevel signal and for separating the multilevel signal into an in-phase component signal and a quadrature component signal;

an automatic equalizer for receiving the in-phase component signal and the quadrature component signal and for automatically equalize the signals;

a decision decoder for multilevel modulated signal in a $2^n$ QAM system (n is an integer equal to or more than four) including an area deciding section for receiving an in-phase component signal and a quadrature component signal of the $2^n$ QAM system multilevel modulated signal, said area deciding section receiving the in-phase component signal (I) and the quadrature component (Q) signal of the QAM signals, said area deciding section deciding to which one of the areas each of the in-phase component (I) and quadrature component (Q) signals belongs; a metric assigning section for producing, according to a result of decision by said area deciding section, metric for each of the in-phase component (I) and quadrature component (Q) signals; a Viterbi decoder for receiving the metric for the in-phase component (I) and quadrature component (0) signals, a convolutional encoder for receiving a data signal outputted from said Viterbi decoder, and a decoder for receiving an output from said convolutional encoder; and a parallel/serial converter for receiving an output from said Viterbi decoder and outputs from said convolutional encoder.

18. A data reception apparatus according to claim 17, wherein:

n is an even number equal to or more than four;

said decoder further includes:

a first decoder for receiving a data signal for an in-phase component from said convolutional encoder and a result of area decision for an in-phase component from said area deciding section; and a second decoder for receiving a data signal for a quadrature component from said convolutional encoder and a result of area decision for a quadrature component from said area deciding section, an output from said first decoder for an in-phase component, an output from said second decoder for a quadrature component, and the output from said Viterbi decoder are inputted to said parallel/serial converter.

19. A data reception apparatus according to claim 17, wherein:

n is an odd number equal to or more than five;

said decoder further includes:

a third decoder for receiving a data signal for an in-phase component and a data signal for a quadrature component from said convolutional encoder, and a result of area decision for an in-phase component and a result of area decision for a quadrature component from said area decision section; and a fourth decoder for receiving a data signal for a quadrature component and a data signal for an in-phase component from said convolutional encoder, and a result of area decision for a quadrature component and a result of area decision for an in-phase component from said area deciding section, an output from said third decoder for an in-phase component, an output from said fourth decoder for a quadrature component, and the output from said Viterbi decoder are inputted to said parallel/serial converter.

* * * * *